United States Patent [19]

Nakatsuka et al.

[11] Patent Number: 5,514,883
[45] Date of Patent: May 7, 1996

[54] FIELD EFFECT TRANSISTOR

[75] Inventors: Tadayoshi Nakatsuka, Osaka; Kaoru Inoue, Kadoma; Hiromasa Fujimoto, Moriguchi; Hideki Yagita, Hirakata, all of Japan

[73] Assignee: Matsushita Electric Industrial Co., Ltd., Osaka, Japan

[21] Appl. No.: 370,211

[22] Filed: Jan. 6, 1995

Related U.S. Application Data

[63] Continuation of Ser. No. 39,933, Mar. 29, 1993, abandoned.

[30] Foreign Application Priority Data

Mar. 30, 1992 [JP] Japan ................................. 4-072062

[51] Int. Cl.$^6$ ............................................. H01L 31/0328
[52] U.S. Cl. .......................... 257/194; 257/192; 257/241
[58] Field of Search .................................. 257/241, 266, 257/267, 280, 287, 194, 244, 281, 14, 24, 27, 196, 20, 192

[56] References Cited

. U.S. PATENT DOCUMENTS 5,019,877  5/1991  Hosogi .

FOREIGN PATENT DOCUMENTS 64-51666  2/1989  Japan .
3-66135   3/1991  Japan .
3-87037   4/1991  Japan .

OTHER PUBLICATIONS

Mok et al., "V–Groove Power Junction Field–Effect Transistor for VHF applications," Sep. 20, 1976, Electronic Letters vol. 12; No. 22, pp. 582–583.

Primary Examiner—Jerome Jackson, Jr.
Assistant Examiner—Nathan Kip Kelley
Attorney, Agent, or Firm—Ratner & Prestia

[57] ABSTRACT

A field effect transistor is disclosed. The field effect transistor includes: a semiconductor substrate having at least an upper face; a semiconductor layered structure, formed on the upper face of the semiconductor substrate, the semiconductor layered structure including a channel layer; a source electric formed on the semiconductor layered structure; a drain electrode formed on the semiconductor layered structure at a position apart from the source electrode in a first direction by a prescribed distance; and a gate electrode, formed on the semiconductor layered structure between the source electrode and the drain electrode. The channel layer includes: a first channel region positioned directly under the source electrode; a second channel region positioned directly under the drain electrode; a third channel region which is adjacent to the first channel region and which is not positioned directly under the gate electrode; a fourth channel region which is adjacent to the second channel region and which is not positioned directly under the gate electrode; and a plurality of stripe-like middle channel regions for connecting the third channel region to the fourth channel region.

15 Claims, 18 Drawing Sheets

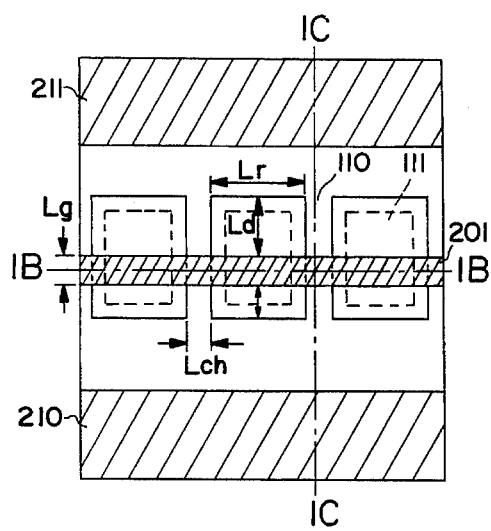
FIG. IA
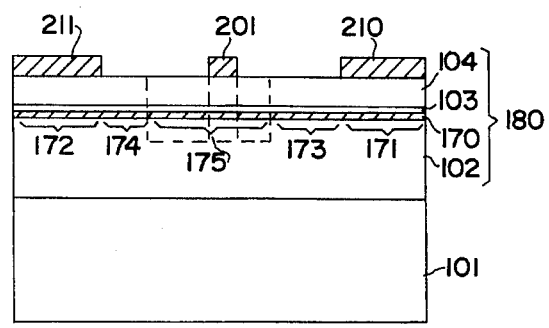
FIG. IC
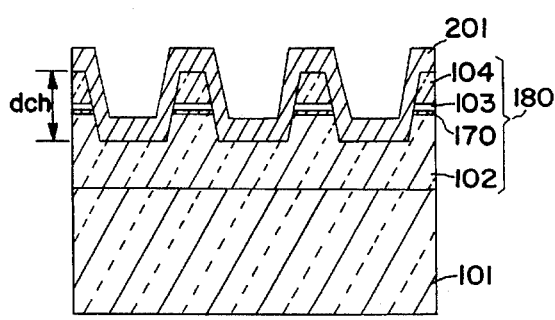
FIG. IB
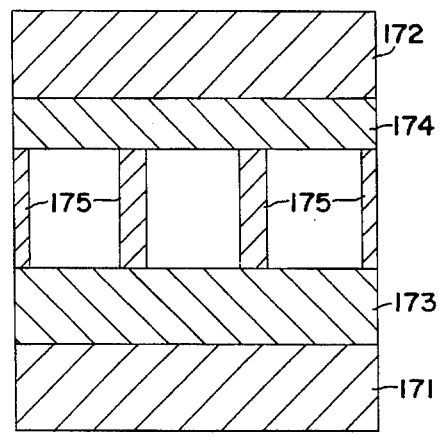
FIG. ID
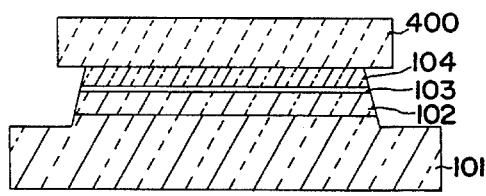
FIG. IE
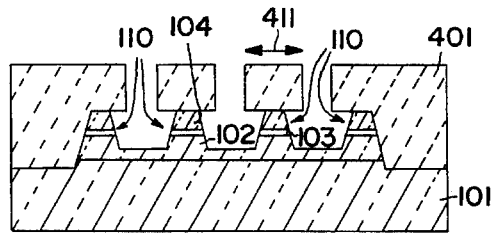
FIG. IF
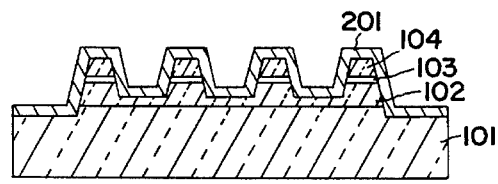
FIG. IG

●--● CONVENTIONAL STRIPE-CHANNEL HEMT
○—○ FET OF PRESENT INVENTION

●--● CONVENTIONAL STRIPE-CHANNEL HEMT
○—○ FET OF PRESENT INVENTION
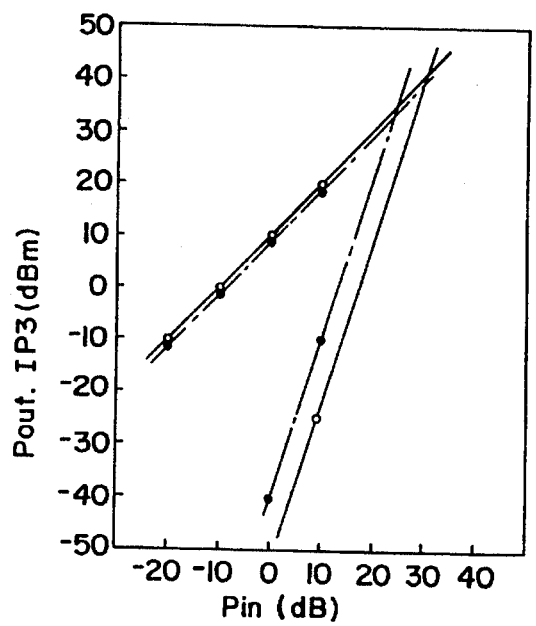
F I G. 22
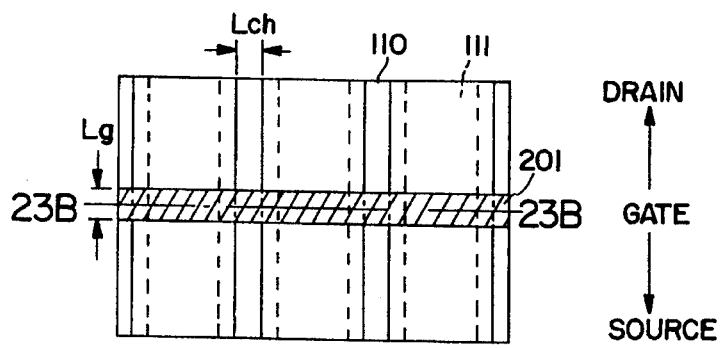
F I G. 23A
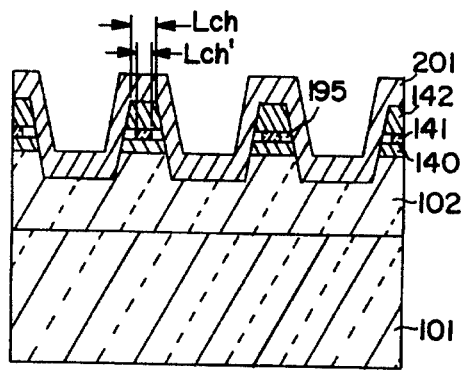
F I G. 23B

-·-· CONVENTIONAL STRIPE-CHANNEL HEMT
——— FET OF PRESENT INVENTION

FIELD EFFECT TRANSISTOR

This application is a continuation of application Ser. No. 08/039,933 filed Mar. 29, 1993, now abandoned.

BACKGROUND OF THE INVENTION

1. Field of the Invention

The present invention relates to a field effect transistor (FET), and more particularly to a metal semiconductor field effect transistor (MESFET).

2. Description of the Related Art

In recent years, mobile communication devices such as car telephones have spread, and direct broadcasting by satellite and commercial satellite communications are widely utilized. Since such communications adopt radio waves of high frequencies, a high frequency receiver with low noise and good distortion characteristics is strongly required. Therefore, a MESFET using a compound semiconductor which has a superior high frequency characteristic, or a high electron mobility transistor (HEMT) which is one type of the MESFETs is used in a high frequency receiver.

In such a transistor, generally, by reducing the gate length thereof, the high frequency characteristic is improved. However, the reduced gate length causes a drain conductance to increase. Moreover, in the saturation area of a drain current, the drain conductance is increased in a nonlinear manner. As a result, there arise a problem in that the distortion characteristic is deteriorated. There also arise a problem in that the gain and noise figure cannot be improved because of the influence by the drain conductance which is increased by the reduced gate length.

In order to solve these problems, a method has been proposed in which a channel region of a MESFET is patterned so as to be a stripe shape, so that carriers contributing to the conduction are confined in one-dimension, whereby a transconductance (gm) is improved and the drain conductance is prevented from being increased in a nonlinear manner.

FIG. 31A is a plan view showing a HEMT having a stripe-shaped channel according to the above method (hereinafter, such a HEMT is referred to as a stripe-channel HEMT). FIG. 31B is a cross-sectional view taken along line 31B—31B in FIG. 31A. A structure of the stripe-channel HEMT is described with reference to these figures. On 8 semi-insulating GaAs substrate 101, a GaAs layer to which impurities are not doped (an i-GaAs layer) 102 is formed. On the i-GaAs layer 102, an i-AlGaAs layer 103 is formed. On the i-AlGaAs layer 103, an n-type AlGaAs layer (an n-AlGaAs layer) 104 is formed. By forming e plurality of recesses 111 which reach the i-GaAs layer 102 from the surface of the n-AlGaAs layer 104, a plurality of parallel ridges 110 are formed. At both ends of each of the plurality of ridges 110, a source electrode 210 and a drain electrode 211 are formed on the n-AlGaAs layer 104. A gate electrode 201 is formed on top and side faces of the ridges 110 and bottom faces of the recesses 111. A two-dimensional electron gas layer 170 is formed in the i-GaAs layer 102 in the vicinity of an interface between the i-GaAs layer 102 and the i-AlGaAs layer 103.

FIG. 32 is an energy band diagram of the stripe-channel HEMT. In FIG. 32, $E_c$ and $E_v$ represent a conduction band and a valence band respectively, and $E_f$ represents the Fermi level. The symbol "=" on the gate metal side represents an interface state, and the symbol "+" in the n-AlGaAs layer 104 represents a space charge. In the HEMT which is practically fabricated, the i-AlGaAs layer 103 is interposed between the i-GaAs layer 102 and the n-AlGaAs layer 104 so as to sufficiently spatially separate electrons from ionized impurities. However, the i-AlGaAs layer 103 is not shown in FIG. 32.

As is shown in FIG. 32, impurities doped to the n-AlGaAs layer 104 are ionized, and electrons are separated. The separated electrons are drawn to the i-GaAs layer 102. In detail, since the separated ions are restricted by positive charges of impurity ions remaining in the n-AlGaAS layer 104, the separated electrons are drawn into a portion of the i-GaAs layer 102 in the vicinity of the interface between the i-GaAs layer 102 and the n-AlGaAs layer 104. Such a portion is referred to as a two-dimensional electron gas layer 170. The two-dimensional electron gas layer 170 only has a thickness of several nanometers (nm). This means that the two-dimensional electron gas layer 170 is substantially formed in two-dimension. Accordingly, the separated electrons can be moved in a two-dimensional electron gas layer 170 in a two-dimensional direction. Such gas is referred to as a two-dimensional electron gas.

A HEMT is a transistor which uses the two-dimensional electron gas as a carrier. Since the two-dimensional electron gas is moved in the i-GaAs layer 102 which has extremely low impurity concentration, the movability of the electrons is extremely high. As a result, it is possible for the HEMT to obtain much higher gm as compared with the usual MESFET. Moreover, since the electrons are not scattered by impurities, the HEMT is superior in noise characteristics.

The two-dimensional electron gas is controlled by changing the gate potential. In general, a drain conductance is increased in a non-linear manner, as the drain voltage is increased. In order to solve the problem, the channel portion is made narrower and hence the electrons are in a quasi one-dimensional state, whereby the confining effect of the electrons is improved. Thus, the gm is improved, and drain conductance is prevented from being increased in the non-linear manner. In the stripe-channel HEMT shown in FIG. 31A, a channel width $L_{ch}$ is 0.2–0.3 μm. The two-dimensional electron gas layer 170 is made narrower by the ridges 110.

FIG. 31C is a cross-sectional view taken along line 31C—31C' in FIG. 31A. FIG. 31D is a plan view of the two-dimensional electron gas layer 170. Below the source electrode 210 and the drain electrode 211, a first channel region 171 and a second channel region 172 are formed respectively, The first channel region 171 and the second channel region 172 form ohmic junctions with the source electrode 210 and the drain electrode 211 respectively. By forming the ridges 110, a plurality of stripe-like middle channel regions 176 are formed. The electrons supplied from the source electrode 210 flow to the drain electrode 211 via the first channel region 171, the plurality of stripe-like middle channel regions 176 and the second channel region 172.

As described above, in the stripe-like middle channel regions 176, the channels are narrowed, so that the electrons are confined substantially in the two directions. That is, the electrons have mobility only in one direction. The electrons in this condition have higher mobility than the two-dimensional electrons.

Referring to FIGS. 33a to 33C, a method of fabricating a conventional stripe-channel HEMT is briefly described. On a semi-insulating GaAs substrate 101, an i-GaAs layer 102, an i-AlGaAs layer 103, and an n-AlGaAs layer 104 are successively formed. Thereafter, a resist pattern 400 is formed, and the semiconductor layers are etched so as to reach the semi-insulating GaAs substrate 101 for isolating elements from each other. Though not shown, a source electrode and a drain electrode made of a gold-germanium alloy and nickel are formed on the n-AlGaAs layer 104. Next, a resist pattern 401 is formed, and the semiconductor layers are etched so as to form a plurality of ridges 110. After removing the resist pattern 400, a resist pattern which defines a gate electrode pattern having a width of 0.2–0.3 µm is formed by an electron beam exposure method or a phase shift method. Then, titanium and aluminum are deposited, and a gate electrode 201 is formed by a lift-off technique.

FIGS. 34A and 34B show the $V_{gs}$-gm characteristic and the $V_{ds}$-$I_{ds}$ characteristic of the conventional stripe-channel HEMT and the conventional MESFET, respectively. As compared with the conventional MESFET, the transconductance (gm) of the conventional stripe-channel HEMT is improved by 20% or more. Also, in the conventional MESFET, the $I_{ds}$ is substantially constant in the vicinity of $V_{ds}$–3 V, and the drain conductance characteristic is improved.

However, the conventional stripe-channel MESFET has the following problems:
(1) the striped channel causes the source resistance to increase, so that it is difficult to improve the transconductance;
(2) the gates are formed in regions other than the channel regions of the FETs, so that the gate capacitance is increased and the noise figure is degraded;
(3) when a HEMT structure is adopted, the two-dimensional electron gas is in contact with the gate electrode, so that the gate breakdown voltage is lowered and the gate leakage current is increased; and
(4) instead of the striped channel, the electron accumulation layer is enlarged as the drain voltage rises, so that it is impossible to prevent the drain conductance from being increased in the non-linear manner.

SUMMARY OF THE INVENTION

The field effect transistor of this invention includes: a semiconductor substrate having at least an upper face; a semiconductor layered structure, formed on the upper face of the semiconductor substrate, the semiconductor layered structure including a channel layer; a source electrode formed on the semiconductor layered structure; a drain electrode formed on the semiconductor layered structure at a position apart from the source electrode in a first direction by a prescribed distance; and a gate electrode, formed on the semiconductor layered structure between the source electrode and the drain electrode, wherein the channel layer includes: a first channel region positioned directly under the source electrode; a second channel region positioned directly under the drain electrode; a third channel region which is adjacent to the first channel region and which is not positioned directly under the gate electrode; a fourth channel region which is adjacent to the second channel region and which is not positioned directly under the gate electrode; and a plurality of stripe-like middle channel regions for connecting the third channel region to the fourth channel region.

In an embodiment, the semiconductor layered structure includes a plurality of recesses arranged in a second direction which is substantially perpendicular to the first direction, and a plurality of stripe-like ridges interposed between the plurality of recesses. The plurality of recesses are positioned between the third channel region and the fourth channel region, and each of the stripe-like ridges includes a corresponding one of the plurality of stripe-like middle channel regions.

In an embodiment, the semiconductor layered structure includes the channel layer to which no impurity is doped, and an electron supplying layer formed on the channel layer.

Alternatively, the field effect transistor includes; a semiconductor substrate having at least an upper face; semiconductor layered structure, formed on the upper face of the semiconductor substrate, the semiconductor layered structure including a channel layer; a source electrode formed on the semiconductor layered structural a drain electrode formed on the semiconductor layered structure at a position apart from the source electrode in a first direction by a prescribed distance; and a gate electrode, formed on the semiconductor layered structure between the source electrode and the drain electrode, wherein the channel layer includes: a first channel region connected to the source electrode; a second channel region connected to the drain electrode; and a plurality of stripe-like middle channel regions for connecting the first channel region to the second channel region, wherein the semiconductor layered structure includes a plurality of recesses arranged in a second direction which is substantially perpendicular to the first direction, and plurality of stripe-like ridges interposed between the plurality of recesses, wherein the plurality of recesses are positioned between the first channel region and the second channel region, and wherein each of the stripe-like ridges includes a corresponding one of the plurality of stripe-like middle channel regions.

In an embodiment, the semiconductor layered structure includes the channel layer to which no impurity is doped, and an electron supplying layer formed on the channel layer.

In an embodiment, the gate electrode includes: a plurality of gate electrode portions formed to cover top and side faces of the plurality of stripe-like ridges, respectively; and an interconnection connecting the plurality of gate electrode portions to each other.

In an embodiment, the semiconductor layered structure includes a p-type semiconductor layer and the channel layer of an n-type semiconductor formed on the p-type semiconductor layer, the channel layer being an uppermost layer of the semiconductor layered structure.

In an embodiment, the field effect transistor further includes means for applying voltage to the p-type semiconductor layer.

In an embodiment, the semiconductor layered structure includes: a first semiconductor layer to which n-type impurities are added at a high concentration; a channel layer, formed on the first semiconductor layer, to which the n-type impurities are added at a concentration lower than that of the first semiconductor layer, the channel layer having a smaller bandgap than that of the first semiconductor layer; and a second semiconductor layer, formed on the channel layer, to which the n-type impurities are added at a concentration higher than that of the channel layer, the second semiconductor layer having a larger bandgap than that of the channel layer.

In an embodiment, the field effect transistor further includes means for applying voltage to the first semiconductor layer.

In an embodiment, the stripe-like ridges each have grooves at side faces thereof, the grooves being formed by removing part of the channel layer.

In an embodiment, the stripe-like ridges each have grooves at side faces thereof, the grooves being formed by removing part of the electron supplying layer.

In an embodiment, the field effect transistor comprises a plurality of gate electrodes formed to cover top and side faces of the ridges and part of bottom faces of the recesses, in a direction perpendicular to a direction in which the ridges extend.

Thus, the invention described herein makes possible the following advantages:

(1) The source and drain resistances are decreased and the drain conductance can be prevented from being increased in a non-linear manner while the drain-source voltage rises, so that the transconductance is improved and superior gain and noise characteristic can be obtained.

(2) By forming gate electrodes only in the plurality of striped channel regions of the FETs so as to connect the gate electrodes via low-resistance interconnections, the gate capacitance and the gate resistance can be reduced, so that a superior noise characteristic can be obtained.

(3) A channel is made into a one-dimensional form due to a depletion layer at the boundary between a p-type impurity layer and an n-type impurity layer, and due to a depletion layer formed by a gate Schottky junction, so that the drain conductance is prevented from being increased in a non-linear manner, whereby a superior third-order distortion characteristic can be obtained.

(4) By additionally providing voltage applying means for the p-type impurity layer, and by applying reverse bias voltage between the n-type impurity layer and the p-type impurity layer, the channel width is further reduced, and the one-dimensional effect can be enhanced, whereby a more superior third-order distortion characteristic can be obtained.

(5) Due to a double heterostructure in which a channel layer having a narrow energy gap is sandwiched between a first and a second semiconductor layers each of which has a wide energy gap, electrons can be confined in the channel layer, so that the one-dimensional effect can be enhanced, whereby a superior third-order distortion characteristic can be obtained.

(6) Due to a double heterostructure in which a channel layer having a narrow energy gap is sandwiched between a first and a second semiconductor layers each of which has a wide energy gap, electrons can be confined in the channel layer; and by providing voltage applying means for the first semiconductor layer, a barrier between the channel layer and the first semiconductor layer is enhanced, so that the one-dimensional effect can be further enhanced, whereby a superior third-order distortion characteristic can be obtained.

(7) Due to a double heterostructure in which a channel layer having a narrow energy gap is sandwiched between a first and a second semiconductor layers each of which has a wide energy gap, electrons can be confined in the channel layer; and by selectively etching the channel layer so as to make the length of a stripe channel portion of the channel layer in the gate length direction smaller than that of the stripe channel portion of the second semiconductor layer in the gate length direction, so that the one-dimensional effect can be enhanced, whereby a superior third-order distortion characteristic can be obtained. Moreover, the stripe channel portion of the channel layer can be prevented from being in contact with e gate electrode, whereby the occurrence of the gate leakage current can be suppressed.

(8) In a HEMT structure, by making the length of a stripe channel portion of an electron supplying layer in a gate length direction smaller than that of a stripe channel portion of a channel layer in the gate length direction, a two-dimensional electron gas layer is prevented from being in contact with a gate metal, the gate leakage current can be prevented from occurring, and the length of the two-dimensional electron gas layer in the gate length direction can be made smaller. As a result, the one-dimensional effect can be enhanced, whereby a superior Schottky characteristic and a superior third-order distortion characteristic can be obtained.

(9) Due to the electron confining effect by a quasi one-dimensional channel, and due to a multi-gate transistor, the drain conductance is prevented from being increased in a non-linear manner, whereby a superior third-order distortion characteristic can be obtained.

These and other advantages of the present invention will become apparent to those skilled in the art upon reading and understanding the following detailed description with reference to the accompanying figures.

BRIEF DESCRIPTION OF THE DRAWINGS

FIG. 1A is a plan view showing an FET in a first example according to the invention.

FIG. 1B is a cross-sectional view taken along line 1B—1B' in FIG. 1A.

FIG. 1C is a cross-sectional view taken along line 1C—1C' in FIG. 1A.

FIG. 1D is a plan view showing a two-dimensional electron gas layer of the FET of the first example.

FIGS. 1E through 1G are cross-sectional views for illustrating a fabricating procedure of the FET of the first example according to the invention.

FIG. 22 shows an input/output characteristic of a high frequency amplifier in which the FET of this example is incorporated.

FIG. 23A is a plan view showing an FET in an eighth example according to the invention.

FIG. 23B is a cross-sectional view taken along line 23B—23B in FIG. 23A.

DESCRIPTION OF THE PREFERRED EMBODIMENTS

EXAMPLE 1

Figure 2:
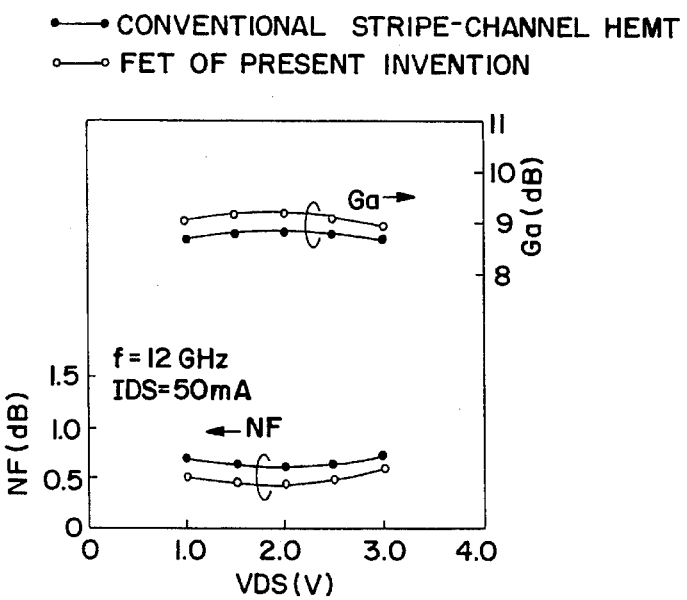
FIG. 2 shows a gain and a noise figure of a high frequency amplifier in which the FET of the first example is incorporated.

Referring to FIGS. 1A through 1D, a first example of the invention will be described. FIG. 1A is a plan view showing a main portion of an FET of the first example. FIGS. 1B and 1C are cross-sectional views taken along lines 1B—1B and 1C—1C in FIG. 1A. FIG. 1D is a plan view showing a two-dimensional electron gas layer in the FET of the first example.

First, the structure of the FET of the first example according to the invention is described. On the upper face of a semi-insulating GaAs substrate 101, a semiconductor layered structure 180 is formed. The semiconductor layered structure 180 includes: an i-GaAs layer 102 (thickness: 500 nm) To which impurities are substantially not doped; an i-$Al_{0.3}Ga_{0.7}As$ layer 103 (thickness: 2 nm) which is formed on the i-GaAs layer 102 and to which impurities are substantially not doped; and an n-$Al_{0.3}Ga_{0.7}As$ layer 104 (thickness: 100 nm) which is formed on the i-$Al_{0.3}Ga_{0.7}As$ layer 103 and to which silicon is doped as n-type impurities at a concentration of $2\times10^{17}/cm^3$. The i-GaAs layer 102 serves as a channel layer and the n-$Al_{0.3}Ga_{0.7}As$ layer 104 serves as an electron supplying layer. The impurities doped into the n-$Al_{0.3}Ga0.7$ layer 104 are ionized, and electrons are supplied to the i-GaAs layer 102. In order to sufficiently spatially separate the electrons from the ionized impurities, the i-$Al_{0.3}Ga_{0.7}As$ layer 103 is interposed between the i-GaAs layer 102 and the n-$Al_{0.3}Ga_{0.7}As$ layer 104. The supplied electrons are accumulated in the i-GaAs layer 102 in the vicinity of the interface between the i-GaAs layer 102 and the t-$Al_{0.3}Ga_{0.7}As$ layer 103, so as to form a two-dimensional electron gas layer 170. The two-dimensional electron gas layer 170 essentially functions as a channel.

On the semiconductor layered structure 180, a source electrode 210 and a drain electrode 211 which is apart from the source electrode 210 by 1.5 μm in a first direction are formed. The upper face of the semiconductor layered structure 180 has a plurality of recesses 111 arranged along a second direction which is substantially perpendicular to the first direction. By the recesses 111, a plurality of ridges 110 are formed. A gate electrode 201 is formed along the second direction on top and side faces of the ridges 110 and bottom faces of the recesses 111. The gate length $L_g$ is 0.3 μm. In the first direction, each recess is defined by one side thereof which is set apart from the gate electrode 201 to the drain electrode 211 by a distance $L_d$=0.8 μm, and the other side thereof which is set apart from the gate electrode 201 to the source electrode 210 by a distance $L_s$=0.3 μm. In the second direction, each recess has a length $L_r$–1.0 μm. The depth of each recess is measured from the surface of the semiconductor layered structure 180. The depth of each recess which is thus measured is 200 nm, so that the recess divides the two-dimensional electron gas layer 170 in the i-GaAs layer 102.

As is shown in FIGS. 1C and 1D, the two-dimensional electron gas layer 170 of the FET having the above structure is constituted of a first channel region 171, a second channel region 172, a third channel region 173, a fourth channel region 174, and a plurality of stripe-like middle channel regions 175. The first channel region 171 is positioned directly under the source electrode 210. The second channel region 172 is positioned directly under the drain electrode 211. The third channel region 173 is adjacent to the first channel region 171 and is not formed directly under the gate electrode 201. The fourth channel region 174 is adjacent to the second channel region 172 and not formed directly under the gate electrode 201. The plurality of stripe-like middle channel regions 175 connect the third channel region 173 to the fourth channel region 174. The plurality of stripe-like middle channel regions 175 is included in the corresponding ridges 110, respectively. The width of the stripe-like middle channel region 175 in the ridge 110 is 0.2 μm. The effective gate width $W_g$ of the FET is determined by the number of the formed ridges 110.

The operation of the FET having the above stripe-channel structure is described below. The FET of this example has the threshold voltage ($V_{th}$) of –0.1 V. The FET of this example normally applies a positive bias voltage $V_{ds}$ between the drain and the source, and a negative bias voltage $V_{gs}$ between the gate and the source. The density of two-dimensional electrons in the stripe-like middle channel regions 175 formed in the i-GaAs layer 102 is controlled by a voltage $V_{gs}$ applied to the gate electrode 201. In the stripe channel having a width of about 0.2 μm in this example, the quasi one-dimensional effect is attained only under the gate electrode 201. Therefore, the third and fourth channel regions 173 and 174 are not required to have a stripe shape. With the above structure, the source resistance and the drain resistance can be reduced, whereby the transconductance is improved and a superior high frequency characteristic can be obtained. FIG. 2 shows a gain ($G_a$) and a noise figure (NF) of a high frequency amplifier in which the FET of this example is incorporated. When compared with the conventional stripe-channel HEMT, $G_a$ is improved by about 0.3 dB, and NF is improved by about 0.15 dB.

In this example, in the first direction, each recess is defined by one side thereof which is set apart from the gate electrode 201 to the drain electrode 211 by a distance $L_d$=0.8 μm, and by the other side thereof which is set apart from the gate electrode 201 to the source electrode 210 by a distance $L_s$=0.3 μm. As described above, when only the channel region directly under the gate electrode 201 is formed so as to have a stripe shape, the quasi one dimensional effect can be obtained. Accordingly, the values of $L_d$ and $L_s$ can be made smaller then those mentioned above.

Next, referring to FIGS. 1E to 1G, a method of fabricating the FET of the first example is described.

On an upper face of a semi-insulating GaAs substrate 101, an i-GaAs layer 102 (thickness: 500 nm) to which impurities are substantially not doped; an i-Al$_{0.3}$Ga$_{0.7}$As layer 103 (thickness: 2 nm) to which impurities are substantially not doped; and an n-Al$_{0.3}$Ga$_{0.7}$As layer 104 (thickness: 100 nm) to which silicon is doped as n-type impurities at a concentration of 2×10$^{17}$/cm$^3$ are successively deposited. These semiconductor layers are successively formed using an epitaxial growth method such as MOCVD or MBE. The i-GaAs layer 102 may include n-type impurities with low concentration.

Thereafter, a resist pattern 400 is formed on the n-Al$_{0.3}$Ga0.7As layer 104, and part of the semiconductor layers is etched so as to reach the semi-insulating GaAs substrate 101 from the surface of the n-Al0.3Ga0.7As layer 104 for isolating elements from each other. After removing the resist pattern 400, a source electrode 210 and a drain electrode 211 made of two layers of gold-germanium alloy (thickness: 130 nm) and nickel (thickness: 40 nm) are formed. Next, an alloy process is performed so as to form an ohmic contact (not shown).

Then, a resist pattern 401 is formed on the n-Al$_{0.3}$Ga$_{0.7}$As layer 104. The width 411 of the resist pattern 401 for forming ridges 111 is set to be 0.6 μm. An etching process is performed from the surface of the n-Al0.3Ga0.7As layer 104 to the depth of 200 nm using the resist pattern 401 as a mask, so as to remove part of the semiconductor layers. By performing an isotropic etching with a solution which contains tartaric acid and hydrogen peroxide, the semiconductor layers under the resist pattern 401 are partially etched, so that the width of the formed ridge is about 0.2 μm.

To the surface of the semi-Insulating GaAs substrate 101 on which the ridges are formed, a resist is applied. Then, a gate electrode pattern (not shown) having a width of 0.2–0.3 μm is formed by an electron beam exposure method or a phase shift method. Then, on the entire face of the resist pattern, a three-layer metal film of titanium (thickness=50 nm) and platinum (thickness: 50 nm) and gold (thickness: 200 nm) is deposited, and a gate electrode 201 is formed by a lift-off technique.

EXAMPLE 2

Figure 3A:
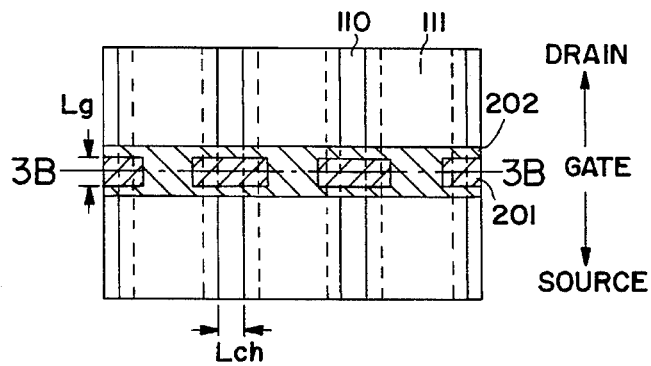
FIG. 3A is a plan view showing an FET in a second example according to the invention.
Figures 3B, 3C:
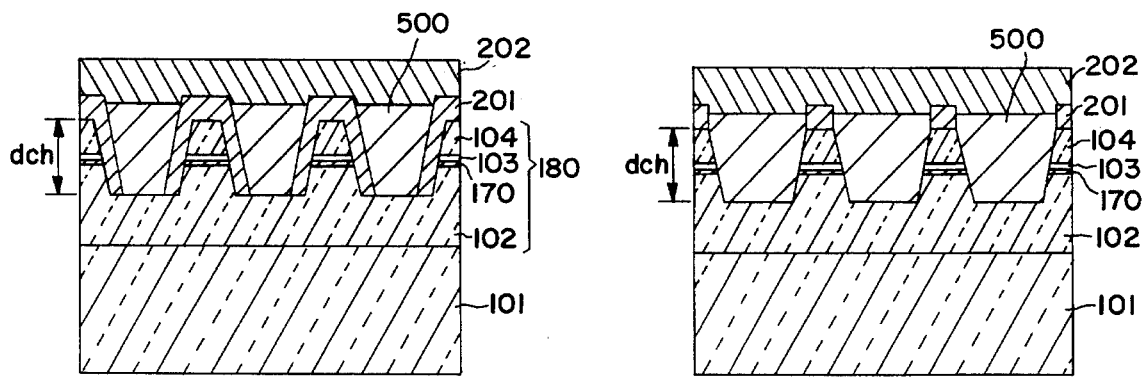
FIG. 3B is a cross-sectional view taken along line 3B—3B in FIG. 3A.
FIG. 3C is a cross-sectional view showing another gate electrode structure for the second example.
Figure 4A:
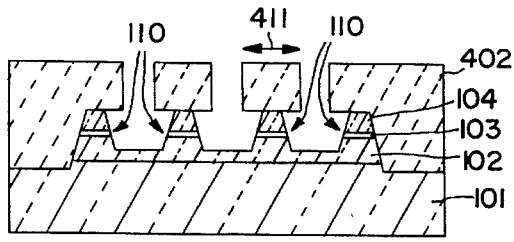
FIGS. 4A through 4D are cross-sectional views for illustrating a fabricating procedure of the FET of the second example according to the invention.
Figure 4C:
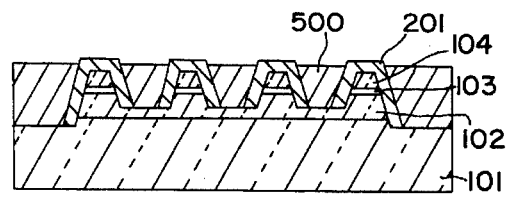
Figure 4B:
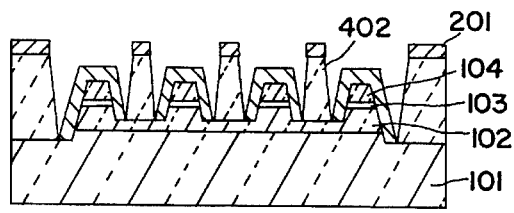
Figure 4D:
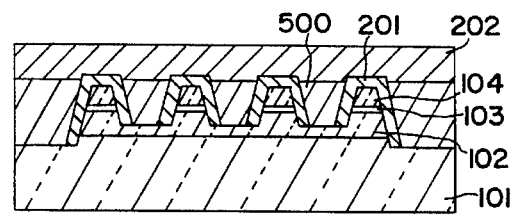

Referring to FIGS. 3A and 3B, a second example of the invention will be described. FIG. 3A is a plan view showing a main portion of an FET of the second example. FIG. 3B is a cross-sectional view taken along line 3B—3B in FIG. 3a. In these figures, portions where a source electrode and a drain electrode are formed are omitted, but the portions are the same as those in the above-described conventional stripe-channel HEMT where the source electrode and the drain electrode are formed.

First, the structure of the FET of the second example according to the invention is described. On the upper face of a semi-insulating GaAs substrate 101, a semiconductor layered structure 180 is formed. The semiconductor layered structure 180 includes: an i-GaAs layer 102 (thickness: 500 nm) to which impurities are substantially not doped; an i-Al$_{0.3}$Ga$_{0.7}$As layer 103 (thickness: 2 nm) which is formed on the i-GaAs layer 102 and to which impurities are substantially not doped; and an n-Al$_{0.3}$Ga$_{O.7}$As layer 104 (thickness: 100 nm) which is formed on the i-Al$_{0.3}$Ga$_{0.7}$As layer 103 and to which silicon is doped as n-type impurities at a concentration of 2×10$^{17}$/cm$^3$. The i-GaAs layer 102 serves as a channel layer and the n-Al$_{0.3}$Ga0.7As layer 104 serves as an electron supplying layer. The impurities doped into the n-Al$_{0.3}$Ga$_{0.7}$ layer 104 are ionized, and electrons are supplied to the i-GaAs layer 102. In order to sufficiently spatially separate the electrons from the ionized impurities, the i-Al$_{0.3}$Ga$_{0.7}$As layer 103 is interposed between the i-GaAs layer 102 and the n-Al$_{0.3}$Ga$_{0.7}$As layer 104. The supplied electrons are accumulated in the i-GaAs layer 102 in the vicinity of the interface between the i-GaAs layer 102 and the i-Al$_{0.3}$Ga$_{0.7}$As layer 103, so as to form a two-dimensional electron gas layer 170. The two-dimensional electron gas layer 170 essentially functions as a channel.

The upper face of the semiconductor layered structure 180 has a plurality of recesses 111. The recesses 111 are formed to reach the source and the drain electrodes (not shown). The recesses 111 have a depth of 200 nm measured from the surface of the semiconductor layered structure 180 in order to divide the two-dimensional electron gas layer 170 in the i-GaAs layer 120. By the recesses 111, a plurality of ridges 110 are formed. Each of the recesses 111 is filled with a silicon oxide film 500.

Figure 31A:
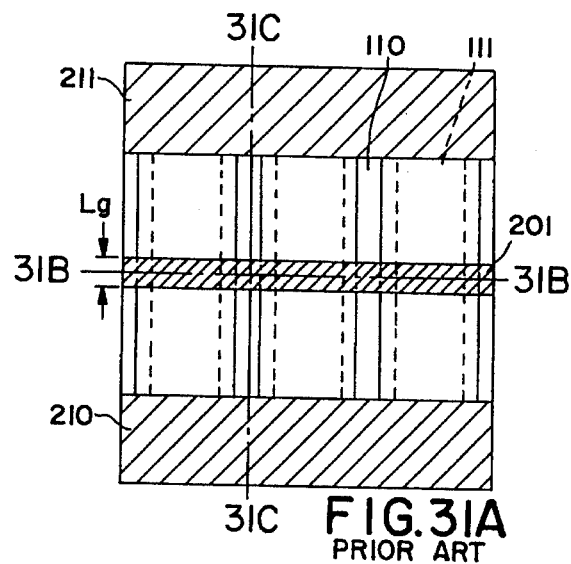
FIG. 31A is a plan view showing a conventional stripe-channel HEMT.
Figure 31B:
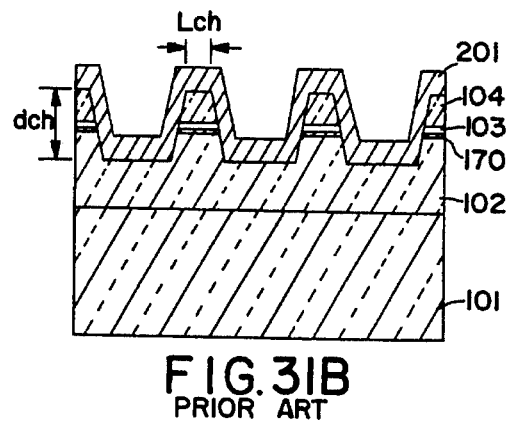
FIG. 31B is a cross-sectional view taken along line 31B—31B in FIG. 31A.
Figure 31C:
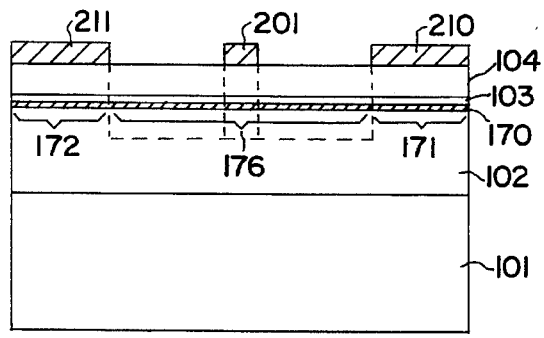
FIG. 31C is a cross-sectional view taken along line 31C—31C in FIG. 31A.
Figure 31D:
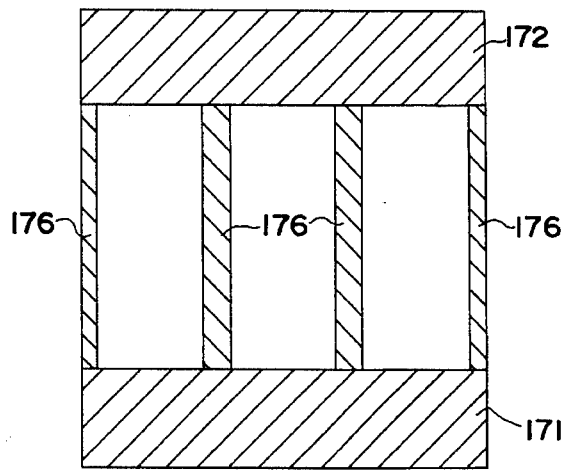
FIG. 31D is a plan view of a two-dimensional electron gas layer in the conventional stripe-channel HEMT.
Figure 32:
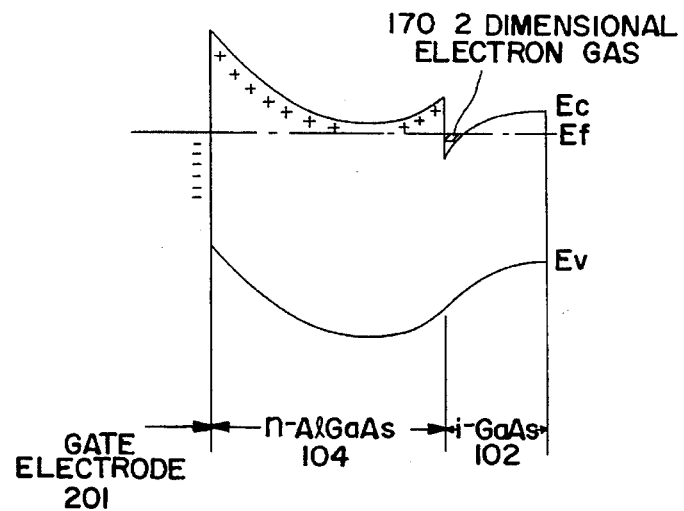
FIG. 32 is an energy band diagram of the conventional stripe-channel HEMT.
Figure 33A:
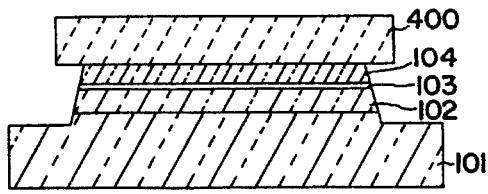
FIGS. 33A through 33C are cross-sectional views illustrating a fabrication method of the conventional stripe-channel HEMT.
Figure 33B:
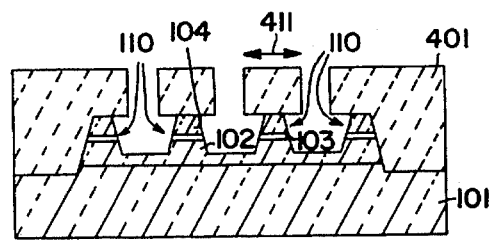
Figure 33C:
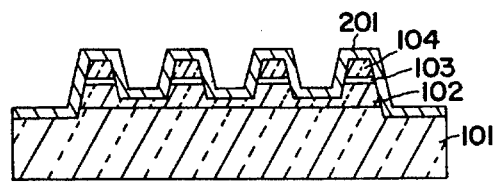
Figure 34A:
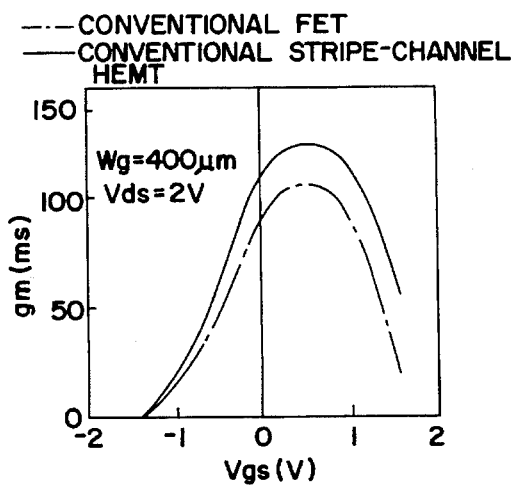
FIGS. 34A and 34B show the $V_{gs}$–gm characteristic and the $V_{ds}$–$I_{ds}$ characteristic of the conventional stripe-channel HEMT.
Figure 34B:
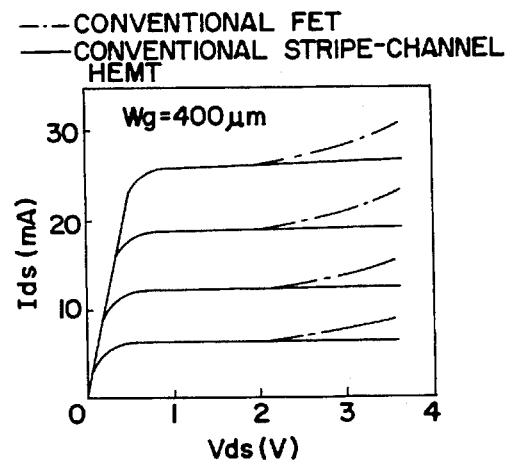

Each of the ridges 110 includes a stripe-shaped two-dimensional electron gas layer 170. The plan structure of a channel is the same as that of the conventional stripe-channel HEMT shown in FIG. 31C. The width of the stripe-shaped two-dimensional electron gas layer 170 included in each of the ridges 110 is 0.2 μm. The effective gate width W$_g$ of the FET is determined by the number of the formed ridges 110.

A plurality of gate electrodes 201 are formed along the second direction on top and side faces of the ridges 110. An interconnection 202 is formed on the gate electrodes 201 for connecting them to each other.

The FET of the second example is different in the gate electrode structure from the conventional stripe-channel HEMT. In this example, the gate electrode is not formed on the bottom face of the recess 111. In this example, the interconnection 202 of gold having a low resistance is formed for connecting the gate electrodes 201 on the ridges 111 to each other. With such a gate electrode structure, the gate resistance can be reduced. Moreover, the capacitance between the gate and the source (C$_{gs}$) and the capacitance between the gate and the drain (C$_{gd}$) can be reduced by about 20% as compared with the conventional stripe-channel HEMT.

Figure 5:
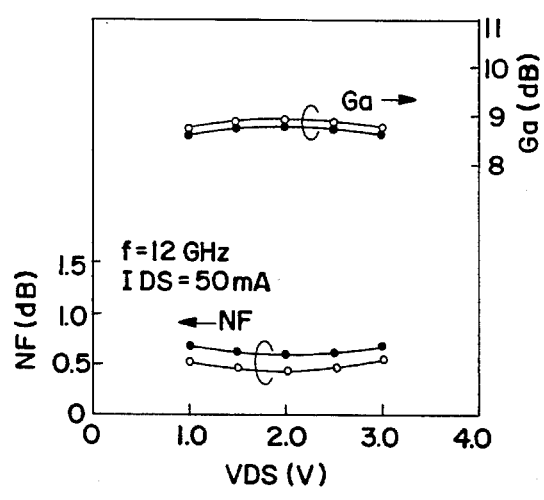
FIG. 5 shows a gain and a noise figure of a high frequency amplifier in which the FET of the second example is incorporated.

FIG. 5 shows a gain (G$_a$) and a noise figure (NF) of a high frequency amplifier in which the FET of this example is incorporated. When compared with the conventional stripe-channel HEMT, G$_a$ is improved by about 0.1 dB, and NF is improved by about 0.15 dB.

In this example, the gate electrode 201 is formed on the top and side faces of the ridge 110. Alternatively, as is shown in FIG. 3C, the gate electrode 201 may be formed only on the top face of the ridge 110. Alternatively, the gate electrode structure in this example may be applied to the FET of the first example.

Next, referring to FIGS. 4A to 4D, a method of fabricating the FET of the second example is described.

On an upper face of a semi-insulating GaAs substrate 101, an A-GaAs layer 102 (thickness: 500 nm) to which impurities are substantially not doped; an i-Al$_{0.3}$Ga$_{0.7}$AS layer 103 (thickness: 2 nm) to which impurities are substantially not doped; and an n-Al$_{0.3}$Ga$_{0.7}$As layer 104 (thickness: 100 nm) to which silicon is doped as n-type impurities at a concentration of 2×10$^{17}$/cm$^3$ are successively deposited. These semiconductor layers are successively formed using an epitaxial growth method such as MOCVD or MBE. In the i-GaAs layer 102 may include n-type impurities at a low concentration.

Thereafter, a resist pattern 400 is formed on the n-Al$_{0.3}$Ga$_{0.7}$As layer 104, and part of the semiconductor layers is etched to reach the semi-insulating GaAs substrate 101 from the surface of the n-Al$_{0.3}$Ga$_{0.7}$As layer 104 for isolating elements from each other. After removing the resist pattern 400, a source electrode 210 and a drain electrode 211 made of two layers of gold-germanium alloy (thickness: 130 nm) and nickel (thickness: 40 nm) are formed. Next, an alloy process is performed so as to form an ohmic contact (not shown).

Then, a resist pattern 401 is formed on the n-Al$_{0.3}$Ga$_{0.7}$As layer 104. The width 411 of the resist pattern 401 for forming ridges 111 is set to be 0.6 μm. An etching process is performed from the surface of the n-Al$_{0.3}$Ga$_{0.7}$As layer 104 to the depth of 200 nm using the resist pattern 401 as a mask, so as to remove part of the semiconductor layers. By performing an isotropic etching with a solution which contains tartaric acid and hydrogen peroxide, the semiconductor layers under the resist pattern 401 are partially etched, so that the width of the formed ridge is about 0.2 μm.

To the surface of the semi-insulating GaAs substrate 101 on which the ridges are formed, a resist is applied. Then, a gate electrode pattern 402 having a gate length of 0.2–0.3 μm is formed by an electron beam exposure method or a phase shift method. Then, on the entire face of the resist pattern, a three-layer metal film of titanium (thickness: 50 nm) and platinum (thickness: 50 nm) and gold (thickness: 200 nm) is deposited, and a gate electrode 201 is formed by a lift-off technique.

Then, a silicon oxide film is deposited on the entire surface of the substrate so as to fill the recesses 110. The silicon oxide film is etched to expose the surface of the gate electrode 201 by an etch back method, whereby the recesses 110 are filled with the silicon oxide films 500.

Again, a resist pattern is formed on the silicon oxide films 500 and on the gate electrode 201 covering the ridges 111. Then, gold (thickness: 200 nm) is deposited, and the interconnection 202 is formed by the lift-off technique.

EXAMPLE 3

Figure 6A:
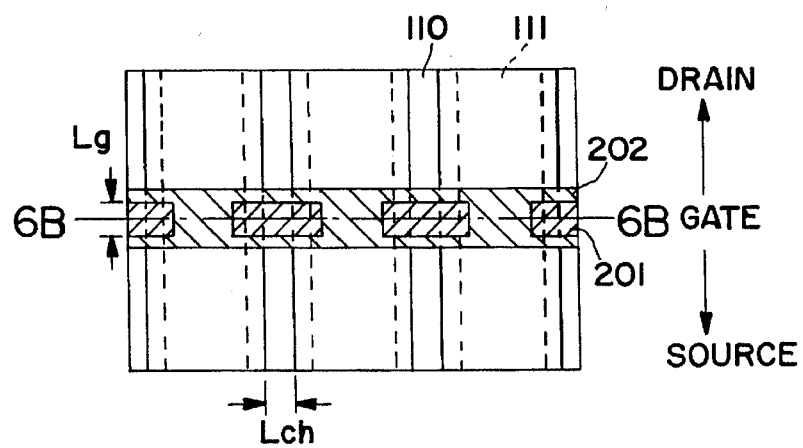
FIG. 6A is a plan view showing an FET in a third example according to the invention.
Figure 6B:
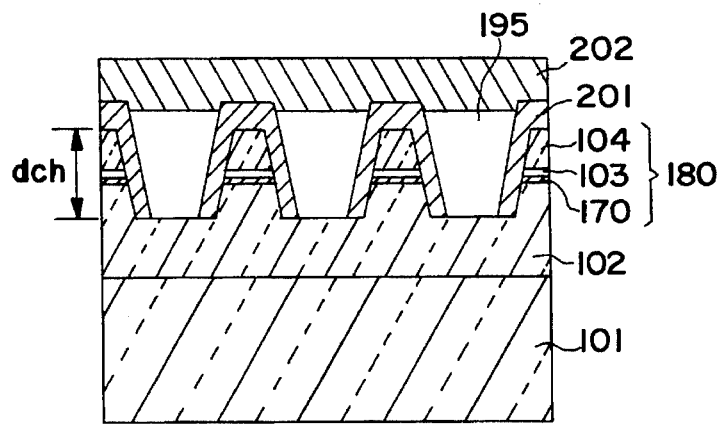
FIG. 6B is a cross-sectional view taken along line 6B—6B in FIG. 6A.

Referring to FIGS. 6A and 6B, a third example of the invention will be described. FIG. 6A is a plan view showing a main portion of an FET of the third example. FIG. 6B is a cross-sectional view taken along line 6B—6B in FIG. 6A. In these figures, portions where a source electrode and a drain electrode are formed are omitted, but the portions are the same as those in the above-described conventional stripe-channel HEMT where the source electrode and the drain electrode are formed.

First, the structure of the FET of the third example according to the invention is described. On the upper face of a semi-insulating GaAs substrate 101, a semiconductor layered structure 180 is formed. The semiconductor layered structure 180 includes: an i-GaAs layer 102 (thickness: 500 nm) to which impurities are substantially not doped; an i-Al$_{0.3}$Ga$_{0.7}$As layer 103 (thickness: 2 nm) which is formed on the i-GaAs layer 102 and to which impurities are substantially not doped; and an n-Al$_{0.3}$Ga$_{0.7}$As layer 104 (thickness: 100 nm) which is formed on the i-Al$_{0.3}$Ga$_{0.7}$As layer 103 and to which silicon is doped as n-type impurities at a concentration of 2×10$^{17}$/cm$^3$. The i-GaAs layer 102 serves as a channel layer and the n-Al$_{0.3}$Ga$_{0.7}$As layer 104 serves as an electron supplying layer. The impurities doped into the n-Al0.3Ga$_{0.7}$ layer 104 are ionized, and electrons are supplied to the i-GaAs layer 102. In order to sufficiently spatially separate the electrons from the ionized impurities, the i-Al0.3Ga$_{0.7}$As layer 103 is interposed between the i-GaAs layer 102 and the n-Al$_{0.3}$Ga$_{0.7}$As layer 104. The supplied electrons are accumulated in the i-GaAs layer 102 in the vicinity of the interface between the k-GaAs layer 102 and the i-Al$_{0.3}$Ga$_{0.7}$As layer 103, so as to form a two-dimensional electron gas layer 170. The two-dimensional electron gas layer 170 essentially functions as a channel.

The upper face of the semiconductor layered structure 180 has a plurality of recesses 111. The recesses 111 are formed so as to reach the source and the drain electrodes (not shown). The recesses 111 have a depth of 200 nm measured from the surface of the semiconductor layered structure 180 in order to divide the two-dimensional electron gas layer 170 in the i-GaAs layer 120. By the recesses 111, a plurality of ridges 110 are formed.

Each of the ridges 110 includes a stripe-shaped two-dimensional electron gas layer 170. The plan structure of a channel is the same as that of the conventional stripe-channel HEMT shown in FIG. 31C. The width of the stripe-shaped two-dimensional electron gas layer 170 included in each of the ridges 110 is 0.2 μm. The effective gate width $W_g$ of the FET is determined by the number of the formed ridges 110.

A plurality of gate electrodes 201 are formed along the second direction on top and side faces of the ridges 110. An interconnection 202 1e formed on the gate electrodes 201 for connecting them to each other.

The FET of the third example is different in the gate electrode structure from the conventional stripe-channel HEMT. In this example, the gate electrode is not formed on the bottom face of the recess 111. In this example, the interconnection 202 of gold having a low resistance is formed for connecting the gate electrodes 201 on the ridges 111 to each other. Moreover, the silicon oxide film 500 in the second example is not formed, but a vacant portion 195 is provided. By using a gate electrode structure with such an air bridge, the capacitance between the gate and the source ($C_{gs}$) and the capacitance between the gate and the drain ($C_{gd}$) can be reduced by about 20% as compared with the conventional stripe-channel HEMT.

Figure 8:
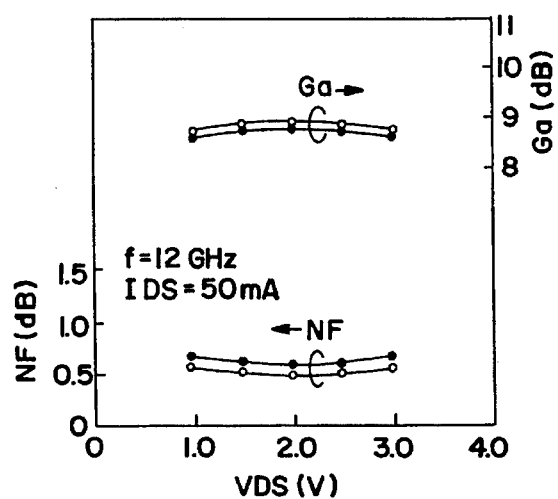
FIG. 8 shows a gain and a noise figure of a high frequency amplifier in which the FET of the third example is incorporated.

FIG. 8 shows a gain ($G_a$) and a noise figure (NF) of a high frequency amplifier in which the FET of this example is incorporated. When compared with the conventional stripe-channel HEMT, $G_a$ is improved by about 0.1 dB, and NF is improved by about 0.1 dB.

Figure 6C:
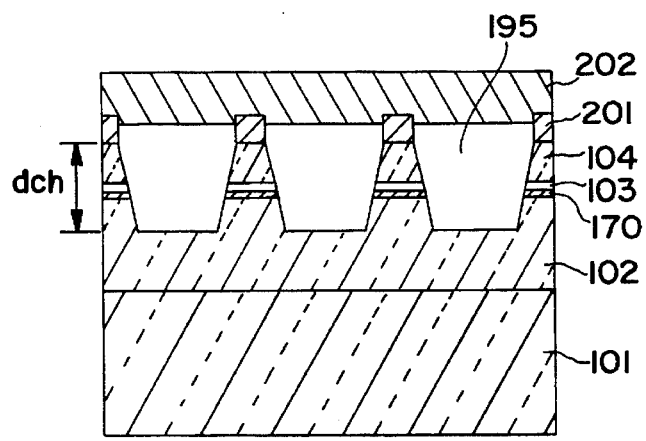
FIG. 6C is a cross-sectional view showing another gate electrode structure for the third example.
Figure 7A:
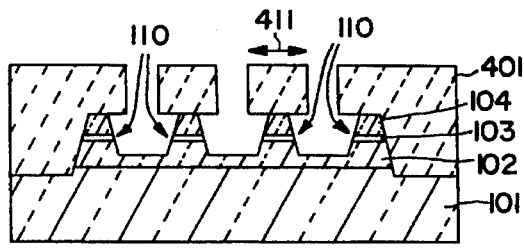
FIGS. 7A through 7D are cross-sectional views for illustrating a fabricating procedure of the FET of the third example according to the invention.
Figure 7B:
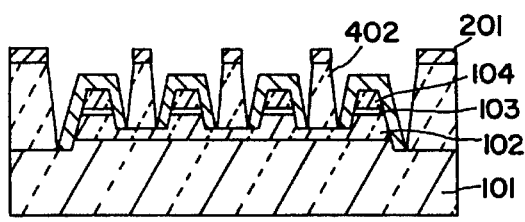
Figure 7C:
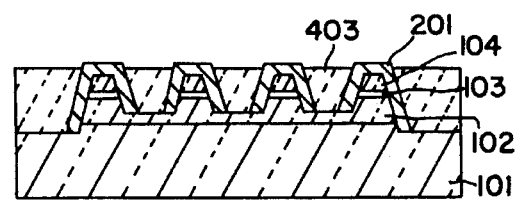
Figure 7D:
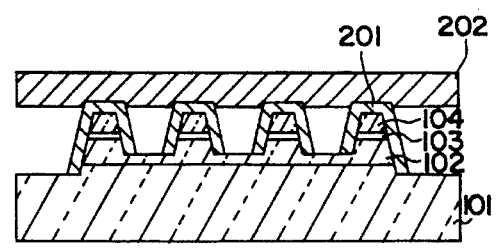

In this example, the gate electrode 201 is formed on the top and side faces of the ridge 110. Alternatively, as is shown in FIG. 6C, the gate electrode 201 may be formed only on the top face of the ridge 110. Alternatively, the gate electrode structure in this example may be applied to the FET of the first example.

Next, referring to FIGS. 7A to 7D, a method of fabricating the FET of the third example is described.

On an upper face of a semi-insulating GaAs substrate 101, an i-GaAs layer 102 (thickness: 500 nm) to which impurities are substantially not doped; an i-Al$_{0.3}$Ga$_{0.7}$As layer 103 (thickness: 2 nm) to which impurities are substantially not doped; and an n-Al$_{0.3}$Ga$_{0.7}$As layer 104 (thickness: 100 nm) to which silicon is doped as n-type impurities at a concentration of 233 10$^{17}$/cm$^3$ are successively deposited. These semiconductor layers are successively formed using an epitaxial growth method such as MOCVD or MBE. In the i-GaAs layer 102 may include n-type impurities at low concentration.

Thereafter, a resist pattern 400 is formed on the n-Al$_{0.3}$Ga$_{0.7}$As layer 104, and part of the semiconductor layers is etched to reach the semi-insulating GaAs substrate 101 from the surface of the n-Al$_{0.3}$Ga$_{0.7}$As layer 104 for isolating elements from each other. After removing the resist pattern 400, a source electrode 210 and a drain electrode 211 made of two layers of gold-germanium alloy (thickness: 130 nm) and nickel (thickness: 40 nm) are formed. Next, an alloy process is performed so as to form an ohmic contact (not shown).

Then, a resist pattern 401 is formed on the n-Al$_{0.3}$Ga$_{0.7}$As layer 104. The width 411 of the resist pattern 401 for forming ridges 111 is set to be 0.6 μm. An etching process is performed from the surface of the n-Al$_{0.3}$Ga$_{0.7}$As layer 104 to the depth of 200 nm using the resist pattern 401 as a mask, so as to remove part of the semiconductor layers. By performing an isotropic etching with a solution which contains tartaric acid and hydrogen peroxide, the semiconductor layers under the resist pattern 401 are partially etched, so that the width of the formed ridge is about 0.2 μm.

To the surface of the semi-insulating GaAs substrate 101 on which the ridges are formed, a resist is applied. Then, a gate electrode pattern 402 having a gate length of 0.2–0.3 μm is formed by an electron beam exposure method or a phase shift method. Then, on the entire face of the resist pattern, a three-layer metal film of titanium (thickness 50 nm) and platinum (thickness: 50 nm) and gold (thickness: 200 nm) is deposited, and a gate electrode 201 is formed by a lift-off technique.

Then, a resist is deposited on the entire surface of the substrate so as to fill the recesses 110. The resist is etched to expose the surface of the gate electrode 201 by an etch back method, whereby the recesses 110 are filled with the resist pattern 403.

Again, a resist pattern is formed on the resist pattern 403 and on the gate electrode 201 covering the ridges 111. Then, gold (thickness: 300 nm) is deposited, and the interconnection 202 is formed by the lift-off technique.

EXAMPLE 4

Figure 9A:
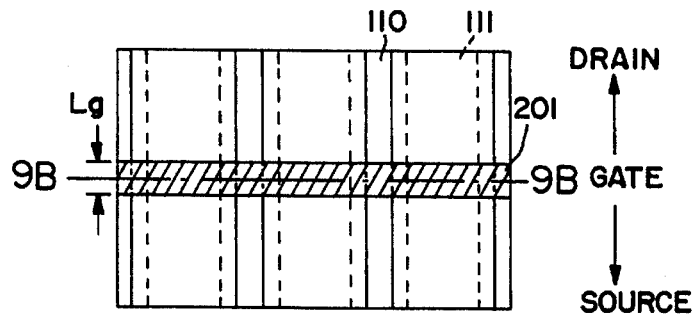
FIG. 9A is a plan view showing an FET in a fourth example according to the invention.
Figure 9B:
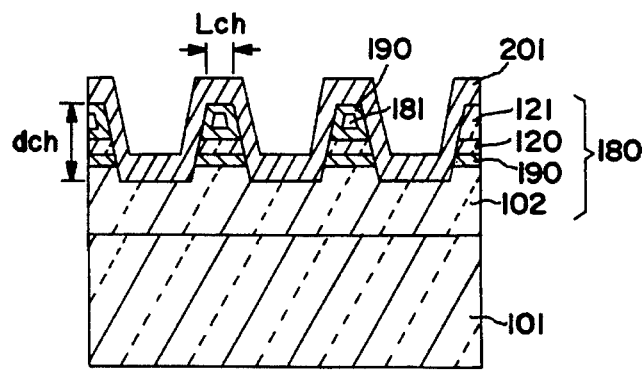
FIG. 9B is a cross-sectional view taken along line 9B—9B in FIG. 9A.

Referring to FIGS. 9A and 9B, a fourth example of the invention will be described. FIG. 9A is a plan view showing a main portion of an FET of the fourth example. FIG. 9B is a cross-sectional view taken along line 9B—9B in FIG. 9A. In these figures, portions where a source electrode and a drain electrode are formed are omitted, but the portions are the same as those in the above-described conventional stripe-channel HEMT where the source electrode and the drain electrode are formed.

First, the structure of the FET of the fourth example according to the invention is described. On the upper face of a semi-insulating GaAs substrate 101, a semiconductor layered structure 180 is formed. The semiconductor layered structure 180 includes: an i-GaAs layer 102 (thickness: 500 nm) to which impurities are substantially not doped; a p-GaAs layer 120 (thickness: 20 nm) which is formed on the i-GaAs layer 102 and to which Mg is doped; and an n-GaAs layer 121 (thickness: 100 nm) which is formed on the p-GaAs layer 120 and to which silicon (5×10$^{17}$/cm$^3$) is doped as n-type impurities.

The upper face of the semiconductor layered structure 180 has a plurality of recesses 111. The recesses 111 are formed to reach the i-GaAs layer 102. The recesses 111 have a depth of 200 nm measured from the surface of the semiconductor layered structure 180. By the recesses 111, a plurality of ridges 110 are formed. A gate electrode 201 is formed in a direction perpendicular to a direction along which the ridges 110 extend, on top and side faces of the ridges 110 and bottom faces of the recesses 111.

Each of the ridges 110 includes the n-GaAs layer 121, the p-GaAs layer 120 and the i-GaAs layer 102. The n-GaAs layer 121 serves as a channel. The plan structure of a channel is the same as that of the conventional stripe-channel HEMT shown in FIG. 31C. The width of the stripe-shaped n-GaAs layer 121 included in each of the ridges 110 is 0.2 μm. The effective gate width $W_g$ of the FET is determined by the number of the formed ridges 110.

At the interface between the gate electrode 201 and the n-GaAs layer 121, a Schottky junction is formed, and a depletion layer is formed in part of the n-GaAs layer 121, At the interface between the p-GaAs layer 120 and the n-GaAs layer 121, a pn junction is formed, and depletion layers are formed in part of the p-GaAs layer 120 and in part of the n-GaAs layer 121. Also, due to the junction between the i-GaAs layer 102 and the p-GaAs layer 120, a depletion layer is formed. In FIG. 9B, depletion layers 190 formed in the n-GaAs layer 121 and in the i-GaAs layer 102 are shown. In the p-GaAs layer 120, carriers (holes) are wholly depleted by the contact of the n-GaAs layer 121 with the i-GaAs layer 102.

The n-GaAs layer 121 is formed into a ridge shape by the recesses 111, and in the n-GaAs layer 121, the depletion layer 190 is formed. Accordingly, the size of the region in which electrons exist is reduced, and a quasi one-dimensional region 181 serves as a channel. Therefore, the transconductance is improved due to the one-dimensional effect. Since the p-GaAs layer 128 is completely depleted, the leakage current is difficult to be produced, even when the drain-source voltage $V_{ds}$ is increased. Therefore, even when the drain-source voltage $V_{ds}$ increases, the drain conductance is not so increased, and is prevented from being increased in a nonlinear manner.

Figure 10:
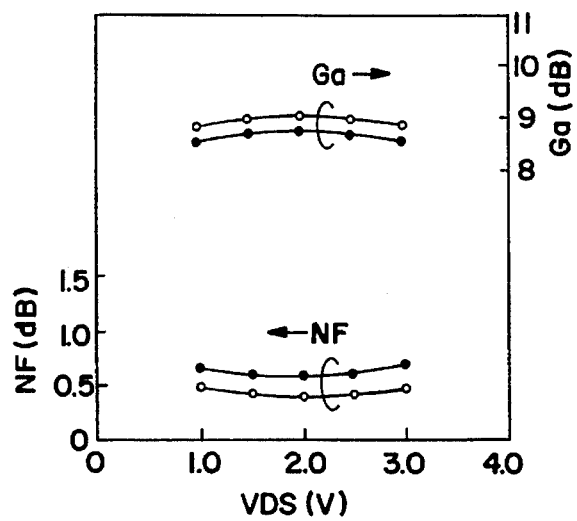
FIG. 10 shows a gain and a noise figure of a high frequency amplifier in which the FET of the fourth example is incorporated.
Figure 11:
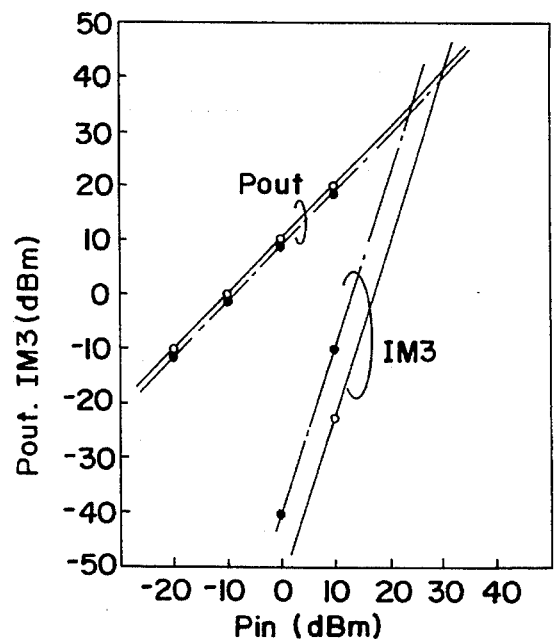
FIG. 11 shows an input/output characteristic of the high frequency amplifier.

FIG. 10 shows a gain ($G_a$) and a noise figure (NF) of a high frequency amplifier in which the FET of this example is incorporated. When compared with the conventional stripe-channel HEMT, $G_a$ is improved by about 0.1 dB, and NF is improved by about 0.1 dB. FIG. 11 shows an input/output characteristic of the high frequency amplifier. An output $P_{out}$ and a third-order high frequency wave IM3 obtained for an input $P_{in}$ are plotted. The crossing point of the $P_{out}$ line and the IM3 line is improved by about 9 dB as compared with the conventional stripe-channel HEMT, so that the third-order high frequency wave is difficult to occur even when a large signal is input.

In this example, as in the conventional stripe-channel MBMT, the ridges 110 are formed for connecting the source electrode to the drain electrode. Alternatively, as is described in the first example, the ridges 110 may be formed only directly under the gate electrode 201.

The FET of this example is fabricated by the same method as the fabrication method for the conventional stripe-channel HEMT or the FET of the first example, except for the formation of the semiconductor layered structure 180.

On the upper face of the semi-insulating GaAs substrate 101, the semiconductor layered structure 180 is formed. In the semiconductor layered structure 180, an i-GaAs layer 102 (thickness: 500 nm) to which impurities are substantially not doped; a p-GaAs layer 120 (thickness: 20 nm) to which is Mg is doped; and an n-GaAs layer 121 (thickness: 100 nm) to which silicon is doped as n-type impurities at a concentration of $5\times10^{17}/cm^3$ are successively deposited.

Thereafter, the process for fabricating the FET of this example is the same as that for fabricating the conventional stripe-channel HEMT.

EXAMPLE 5

Figure 12:
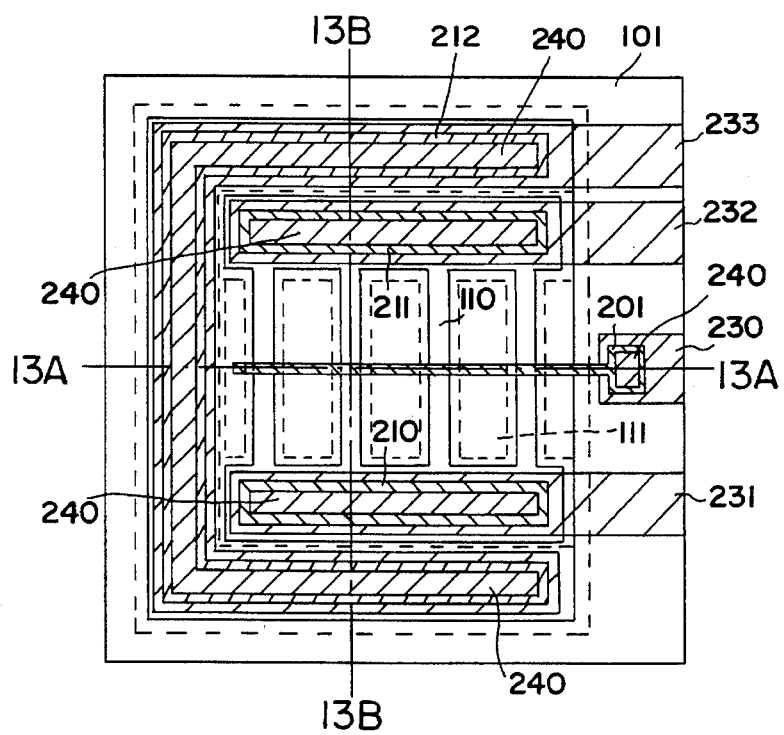
FIG. 12 is a plan view showing an FET in a fifth example according to the invention.
Figure 13A:
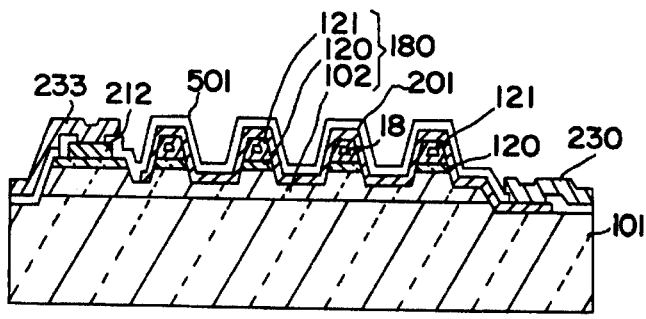
FIG. 13A is a cross-sectional view taken along line 13A—13A in FIG. 12.
Figure 13B:
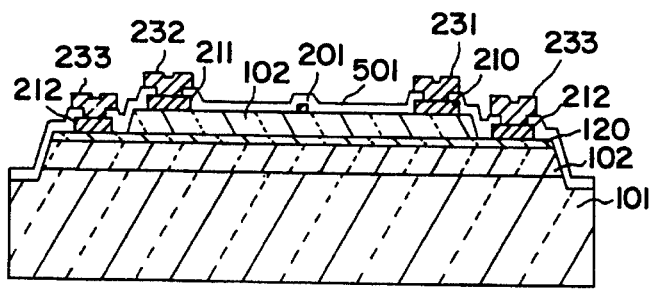
FIG. 13B is a cross-sectional view taken along line 13B—13B in FIG. 12.

Referring to FIGS. 12, 13A and 13B, a fifth example of the invention will be described. FIG. 12 is a plan view showing an FET of the fifth example. FIG. 13A is a cross-sectional view taken along line 13A—13A in FIG. 12. FIG. 13B is a cross-sectional view taken along line 13B—13B in FIG. 12.

First, the structure of the FET of the fifth example according to the invention is described. On the upper face of a semi-insulating GaAs substrate 101, a semiconductor layered structure 180 is formed. The semiconductor layered structure 180 includes: an i-GaAs layer 102 (thickness: 500 nm) to which impurities are substantially not doped; a p-GaAs layer 120 (thickness: 20 nm) which is formed on the i-GaAs layer 102 and to which Mg is doped; and an n-GaAs layer 121 (thickness: 100 nm) which is formed on the p-GaAs layer 120 and to which silicon is doped as n-type impurities at a concentration of $5\times10^{17}/cm^3$.

On the n-GaAs layer 121 of the semiconductor layered structure 180, a source electrode 210 and a drain electrode 211 which is set apart from the source electrode 210 by 1.5 μm in a first direction are formed. The upper face of the semiconductor layered structure 180 has a plurality of recesses 111. The recesses 111 are formed to reach the i-GaAs layer 102. The recesses 111 have a depth of 200 nm measured from the surface of the semiconductor layered structure 180. By the recesses 111, a plurality of ridges 110 are formed. A gate electrode 201 is formed along a second direction which is substantially perpendicular to the first direction on top and side faces of the ridges 110 and bottom faces of the recesses 111. In part of an outer peripheral portion of the surface area of the semiconductor layered structure 180 which is sandwiched between the source electrode 210 and the drain electrode 211, the p-type GaAs layer 120 is exposed. On the exposed portion of the p-type GaAs layer 120, a p-layer bias electrode 212 is formed. The p-type GaAs layer 120 and the p-layer bias electrode 212 forms an ohmic junction. In order to protect the surface of the FET, a silicon nitride film 501 is formed so as to cover the entire upper lace of the semi-insulating GaAs substrate 101. The source electrode 210, the drain electrode 211, the p-layer bias electrode 212, and the gate electrode 201 are connected to a source interconnection 231, a drain interconnection 232, a p-layer bias interconnection 233, and a gate interconnection 230, respectively, via windows 240 formed in the silicon nitride film 501.

Figure 14:
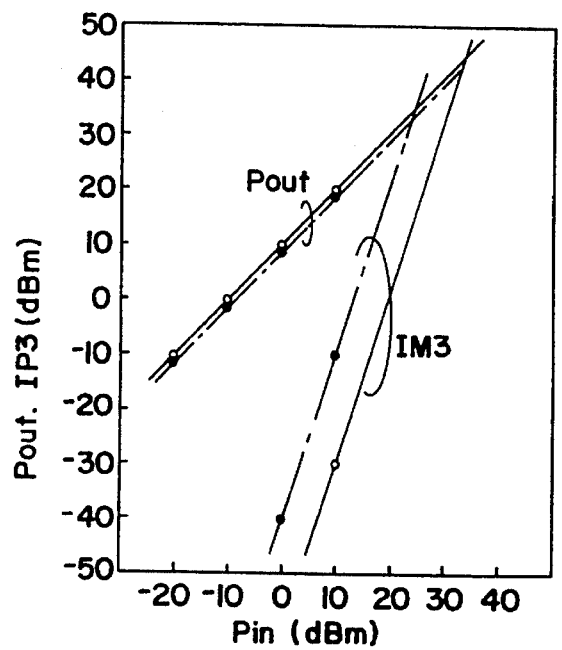
FIG. 14 shows an input/output characteristic of a high frequency amplifier in which the FET of the fifth example is incorporated.

Each of the ridges 110 includes the n-GaAs layer 121, the p-GaAs layer 120 and the i-GaAs layer 102. The n-GaAs layer 121 serves as a channel. The plan structure of a channel is the same as that of the conventional stripe-channel HEMT shown in FIG. 31C. The width of the stripe-shaped n-GaAs layer 121 included in each of the ridges 110 is 0.2 μm. The effective gate width $W_g$ of the FET is determined by the number of the formed ridges 110. At the interface between the gate electrode 201 and the n-GaAs layer 121, a Schottky junction is formed, and a depletion layer is formed in part of the n-GaAs layer 121. At the interface between the p-GaAs layer 120 and the n-GaAs layer 121, a pn junction is formed, and depletion layers are formed in part of the p-GaAs layer 120 and in part of the n-GaAs layer 121. Also, due to the junction between the i-GaAs layer 102 and the p-GaAs layer 120, a depletion layer is formed. The depletion layer formed in the n-GaAs layer 121 makes the area in which electrode can exist in the n-GaAs layer 121 narrower, and a quasi one-dimensional channel region 181 is formed. This example is different from the fourth example in the point where a p-layer bias electrode 212 is provided so as to offer means for applying voltage to the p-GaAs layer 120. By applying a negative voltage to the p-GaAs layer 120, the depletion layer formed in the n-GaAs layer 121 in the vicinity of the interface between the n-GaAs layer 121 and the p-GaAs layer 120 is made larger, so that the quasi one-dimensional channel region 181 is made even more narrower. As a result, a superior one-dimensional effect can be attained. Especially, the leakage current is reduced. FIG. 14 shows an input/output characteristic of a high frequency amplifier in which the FET of this example is incorporated, when the voltage of −1.0 V is applied to the p-GaAs layer 120. An output $P_{out}$ and a third-order high frequency wave IM3 obtained for an input $P_{in}$ are plotted. The crossing point of the $P_{out}$ line and the IM3 line is improved by about 12 dB as compared with the conventional stripe-channel HEMT, so that the third-order high frequency wave is difficult to occur even when a large signal is input.

In this example, as in the conventional stripe-channel HEMT, the ridges 110 are formed for connecting the source electrode 210 to the drain electrode 211. Alternatively, as is described in the first example, the ridges 110 may be formed only directly under the gate electrode 201.

The FET of this example is fabricated by the same methods as the methods for fabricating the FET in the first to fourth examples and the method for fabricating the conventional stripe-channel HEMT, except for the formation of the p-layer bias electrode 212 in the p-GaAs layer 120. After separating the elements, part of the semiconductor layered structure 180 is removed by an etching process from the surface of the semiconductor layered structure 180 in order to reach the p-GaAs layer 120. As a result, the region of the p-GaAs layer 120 where the p-layer bias electrode 212 is formed is exposed. When the source electrode 210 and the drain electrode 211 are formed, the p-layer bias electrode 212 is simultaneously formed. In this manner, the p-layer bias electrode 212 can be provided in the p-GaAs layer 120.

EXAMPLE 6

Figures 15A, 15B:
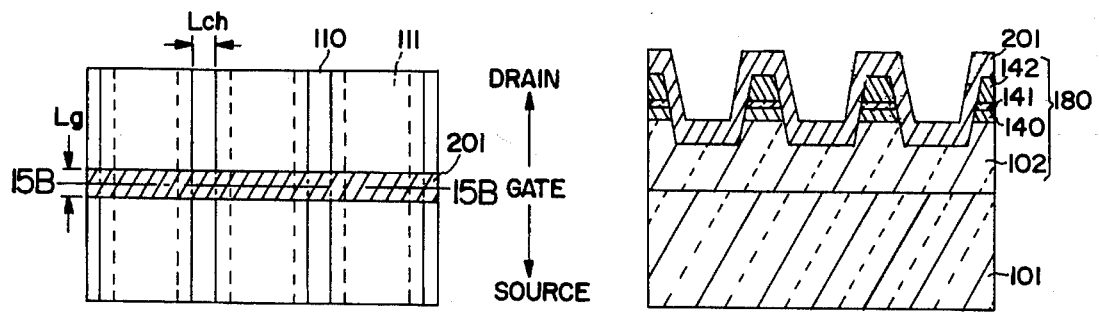
FIG. 15A is a plan view showing an FET in a sixth example according to the invention.
FIG. 15B is a cross-sectional view taken along line 15B—15B in FIG. 15A.

Referring to FIGS. 15A and 15B, a sixth example of the invention will be described. FIG. 15A is a plan view showing a main portion of an FET of the sixth example. FIG. 15B is a cross-sectional view taken along line 15B—15B in FIG. 15A. In these figures, portions where a source electrode and a drain electrode are formed are omitted, but the portions are the same as those in the above-described conventional stripe-channel HEMT where the source electrode and the drain electrode are formed.

First, the structure of the FET of the sixth example according to the invention is described. On the upper face of a semi-insulating GaAs substrate 101, a semiconductor layered structure 180 is formed. The semiconductor layered structure 180 includes: an i-GaAs layer 102 (thickness: 500 nm) at an impurity concentration of $2\times10^{16}$/cm$^3$ or less, and to which impurities are substantially not doped; an n-AlGaAS layer 140 (thickness: 50 nm) which is formed on the i-GaAs layer 102 and to which silicon is doped at a concentration of $2\times10^{18}$/cm$^3$; an n-InGaAs layer 141 (thickness: 10 nm) which is formed on the n-AlGaAs layer 140 and to which silicon is doped at a concentration of $5\times10^{17}$/cm$^3$; and an n-AlGaAs layer 142 (thickness: 20 nm) which is formed on the n-InGaAs layer 141 and to which silicon is doped at a concentration of $2\times10^{18}$/cm$^3$. The n-AlGaAs layer 140 and the n-AlGaAs layer 142 are doped with n-type impurities at a high concentration as a first semiconductor layer and a second semiconductor layer, respectively. The n-InGaAs layer 141 serves as a channel layer, and has e smaller bandgap and a lower impurity concentration than those of the n-AlGaAs layer 140 and the n-AlGaAs layer 142.

The upper face of the semiconductor layered structure 180 has a plurality of recesses 111. The recesses 111 are formed so as to reach the i-GaAs layer 102. The recesses 111 have a depth of 200 nm measured from the surface of the semiconductor layered structure 180. By the recesses 111, a plurality of ridges 110 are formed. On top and side faces of the ridges 110 and bottom faces of the recesses 111, a gate electrode 201 is formed along a direction perpendicular to a direction in which the ridges 110 extend.

Each of the ridges 110 includes the n-AlGaAs layer 142, the n-InGaAs layer 141, the n-AlGaAs layer 140 and the i-GaAs layer 102. The n-InGaAs layer 141 serves as a channel. The plan structure of a channel is the same as that of the conventional stripe-channel HEMT shown in FIG. 31C. The width of the stripe-shaped n-InGaAs layer 141 included in each of the ridges 110 is 0.2 μm. The effective gate width $W_g$ of the FET is determined by the number of the formed ridges 110.

Figure 16:
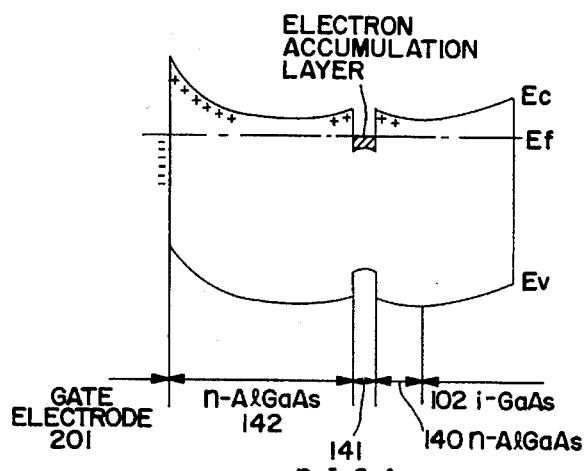
FIG. 16 is a energy band diagram under the gate electrode in the sixth example.

FIG. 16 is en energy band diagram under the gate electrode according to this example. Due to a double heterostructure formed by the two n-AlGaAs layers 140 and 142 and the n-InGaAs layer 141, electrons are accumulated in the n-InGaAs layer 141 which has a smaller bandgap than the n-AlGaAs layer. The electrons accumulated in the n-InGaAs layer 141 which serves as the channel can be confined in two directions, i.e., from the upper side and the lower side, so that the increase in leakage current can be prevented even when the voltage between the drain and the source increases. Therefore, if the drain-source voltage $V_{ds}$ increases, the drain conductance is not so increased, and is prevented from being increased in the non-linear manner.

Figure 17:
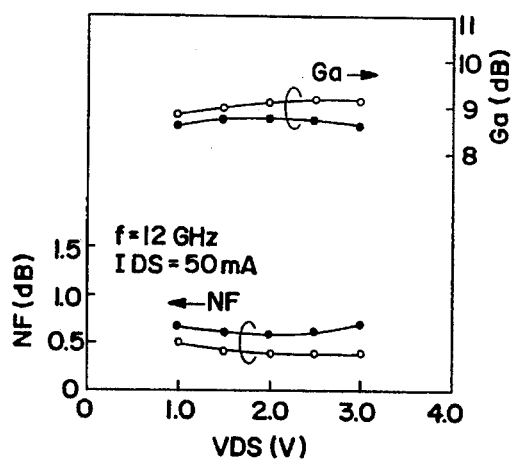
FIG. 17 shows a gain and a noise figure of a high frequency amplifier in which the FET of the sixth example is incorporated.
Figure 18:
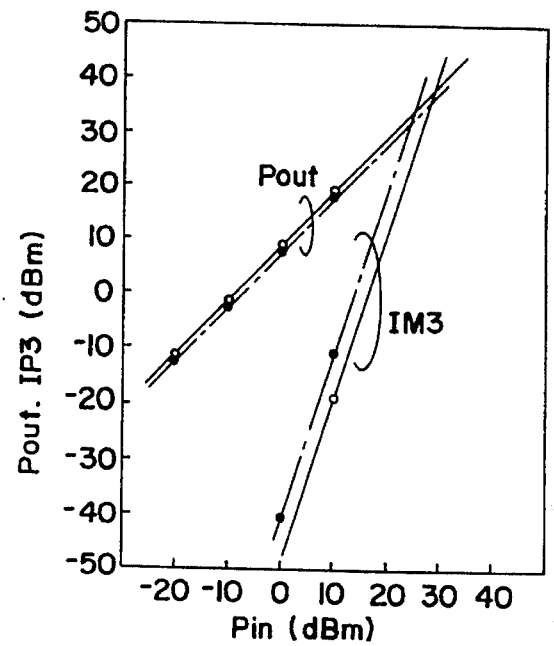
FIG. 18 shows an input/output characteristic of the high frequency amplifier.

FIG. 17 shows a gain ($G_a$) and a noise figure (NF) of a high frequency amplifier in which the FET of this example is incorporated. When compared with the conventional stripe-channel HSMT, $G_a$ is improved by about 0.2–0.5 dB, and NF is improved by about 0.3–0.5 dB. FIG. 18 shows an input/output characteristic of the high frequency amplifier. An output $P_{out}$ and a third-order high frequency wave IM3 obtained for an input $P_{in}$ are plotted. The crossing point of the $P_{out}$ line and the IM3 line is improved by about 7 dB as compared with the conventional stripe-channel HSMT, so that the third-order high frequency wave is difficult to occur even when a large signal is input.

In this example, as in the conventional stripe-channel HEMT, the ridges 110 are formed so as to connect the source electrode 210 to the drain electrode 211. Alternatively, as in the first example, the ridged 110 may be formed only directly under the gate electrode 201. The gate electrode structure may be a structure in which a plurality of gate electrodes 201 and an interconnection 202, the same as described in the second or third example.

Next, a fabrication method for the FET of the sixth example is described. On an upper face of a semi-insulating GaAs substrate 101, an i-GaAs layer 102 (thickness: 500 nm) at an impurity concentration of $2\times10^{16}$/cm$^3$ or less, and to which impurities are substantially not doped; an n-AlGaAs layer 140 (thickness: 50 nm) to which silicon is doped at a concentration of $2\times10^{18}$/cm$^3$; an n-lnGaAs layer 141 (thickness: 10 nm) to which silicon is doped as a concentration of $5\times10^{17}$/cm$^3$; and an n-AlGaAS layer 142 (thickness: 20 nm) to which silicon is doped at a concentration of $2\times10^{18}$/cm$^3$ are successively deposited.

Thereafter, the fabrication process is the same as that for the conventional stripe-channel HEMT.

EXAMPLE 7

Figure 19:
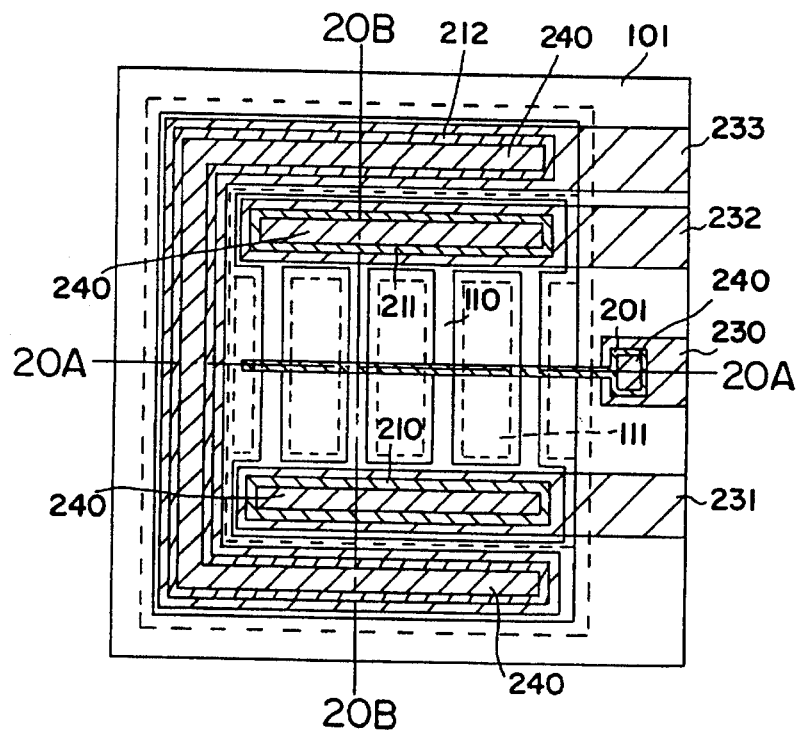
FIG. 19 is a plan view showing an FET in a seventh example according to the invention.
Figure 20A:
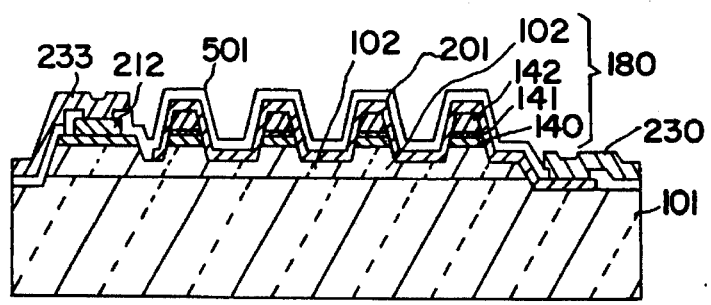
FIG. 20A is a cross-sectional view taken along line 20A—20A in FIG. 19.
Figure 20B:
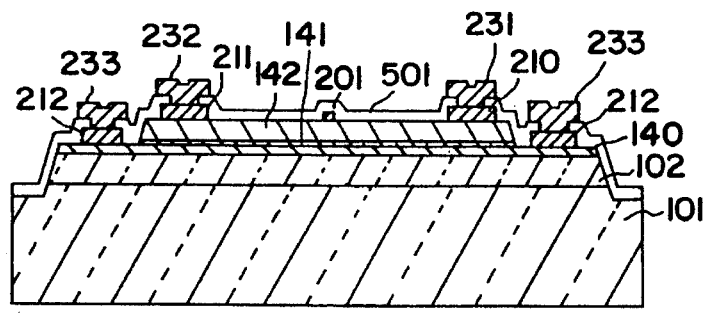
FIG. 20B is a cross-sectional view taken along line 20B—20B in FIG. 19.

Referring to FIGS. 19, 20A and 20B, a seventh example of the invention will be described. FIG. 19 is a plan view showing an FET of the seventh example. FIG. 20A is a cross-sectional view taken along line 20A—20A in FIG. 19. FIG. 20B is a cross-sectional view taken along line 20B—20B in FIG. 19.

First, the structure of the FET of the seventh example according to the invention is described. On the upper face of a semi-insulating GaAs substrate 101, a semiconductor layered structure 180 is formed. The semiconductor layered structure 180 includes: an i-GaAs layer 102 (thickness: 500 nm) at an impurity concentration of $2\times10^{16}/cm^3$ or less, and to which impurities are substantially not doped; an n-AlGaAs layer 140 (thickness: 50 nm) which is formed on the i-GaAs layer 102 and to which silicon is doped at a concentration of $2\times10^{18}/cm^3$; an n-InGaAs layer 141 (thickness: 10 nm) which is formed on the n-AlGaAs layer 140 and to which silicon is doped as n-type impurities at a concentration of $5\times10^{17}/cm^3$; and an n-AlGaAs layer 142 (thickness: 20 nm) which is formed on the n-InGaAs layer 141 and to which silicon is doped at a concentration of $2\times10^{18}/cm^3$. The n-AlGaAs layer 140 and the n-AlGaAs layer 142 are doped with n-type impurities at a high concentration as a first semiconductor layer and a second semiconductor layer, respectively. The n-InGaAs layer 141 serves as a channel layer, and has a smaller bandgap and a lower impurity concentration than those of the n-AlGaAs layer 140 and the n-AlGaAs layer 142.

On the n-AlGaAs layer 142 of the semiconductor layered structure 180, a source electrode 210 and a drain electrode 211 which is apart from the source electrode 210 by 1.5 μm in a first direction are formed. The upper face of the semiconductor layered structure 180 has a plurality of recesses 111. The recesses 111 are formed to reach the i-GaAs layer 102. The recesses 111 have a depth of 200 nm measured from the surface of the semiconductor layered structure 180. By the recesses 111, a plurality of ridges 110 are formed. A gate electrode 201 is formed on top and side faces of the ridges 110 and bottom faces of the recesses 111, in a second direction which is substantially perpendicular to the first direction.

Each of the ridges 110 includes the n-AlGaAs layer 142, the n-InGaAs layer 141, the n-AlGaAs layer 140 and the i-GaAs layer 102. The n-InGaAs layer 141 serves as a channel. The plan structure of a channel is the same as that of the conventional stripe-channel HEMT shown in FIG. 31C. The width of the stripe-shaped n-InGaAs layer 141 included in each of the ridges 110 is 0.2 μm. The effective gate width $W_g$ of the FET is determined by the number of the formed ridges 110.

At part of an outer periphery portion of the surface area of the semiconductor layered structure 180 between the source electrode 210 and the drain electrode 211, the n-AlGaAs layer 140 is exposed. On the exposed portion of the n-AlGaAs layer 140, an n-AlGaAs layer bias electrode 212 is formed. The n-AlGaAs layer 140 and the n-AlGaAs layer bias electrode 212 forms an ohmic junction. In order to protect the surface of the FET, a silicon nitride film 581 is formed so as to cover the entire upper face of the semi-insulating GaAs substrate 101. The source electrode 210, the drain electrode 211, the n-AlGaAs layer bias electrode 212, and the gate electrode 201 are connected to a source interconnection 231, a drain interconnection 232, an n-AlGaAs layer bias interconnection 233, and a gate interconnection 230, respectively, via windows 240 formed in the silicon nitride film 501.

Figure 21:
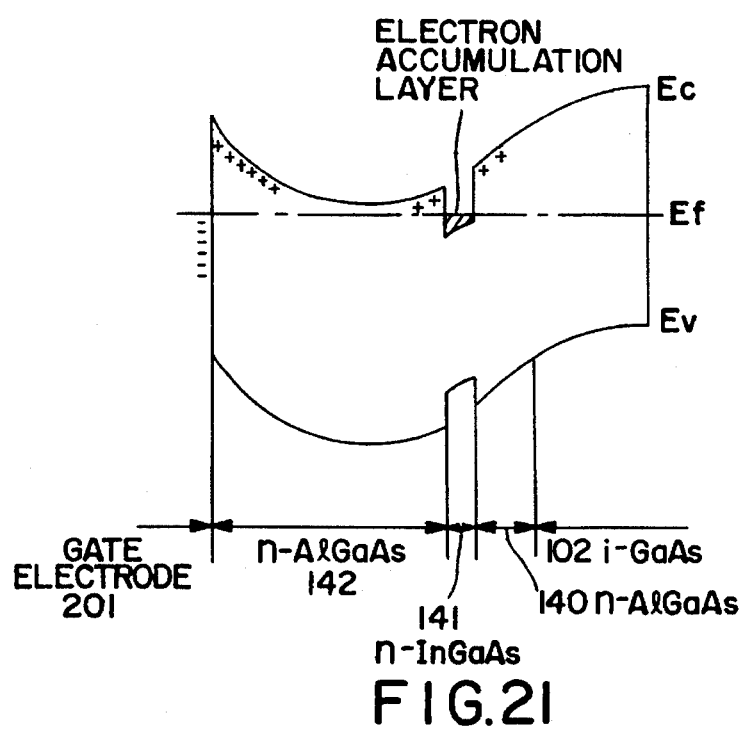
FIG. 21 is a energy band diagram under the gate electrode in the seventh example.

In the FET of this example, as in the sixth example, by using a double heterostructure, electrons are accumulated in the n-InGaAs layer 141. A difference from the sixth example is in that the n-AlGaAs layer 140 is provided with the n-AlGaAs layer bias electrode 212 so as to include means for applying voltage to the n-AlGaAs layer 140. By applying a negative voltage to the n-AlGaAs layer 140, the potential energy of the conductive band ($E_c$) of the n-AlGaAs layer 140 is increased, as is shown in FIG. 21, the electrons are strongly confined in the n-InGaAs layer 140. As a result, the leakage current is reduced. Therefore, if the drain-source voltage $V_{ds}$ increases, the drain conductance is not so increased, and is prevented from being increased in the non-linear manner.

FIG. 22 shows a gain ($G_a$) and a noise figure (NF) of a high frequency amplifier in which the FET of this example is incorporated, when the voltage of −1.0 V is applied to the n-InGaAs layer 140. An output $P_{out}$ and a third-order high frequency wave IM3 obtained for an input $P_{in}$ are plotted. The crossing point of the Pout line and the IM3 line is improved by about 10 dB as compared with the conventional stripe-channel HEMT, so that the third-order high frequency wave is difficult to occur even when a large signal is input.

In this example, as in the conventional stripe-channel HEMT, the ridges 110 are formed so as to connect the source electrode 210 to the drain electrode 211. Alternatively, as in the first example, the ridged 110 may be formed only directly under the gate electrode 201. The gate electrode structure may be a structure in which a plurality of gate electrodes 201 and an interconnection 202, the same as described in the second or third example.

The FET of this example can be fabricated by the same method as that for the FET of the fifth example, except for the semiconductor layers of the semiconductor layered structure 180.

EXAMPLE 8

Referring to FIGS. 23A and 23B, an eighth example of the invention will be described. FIG. 23A is a plan view showing a main portion of an FET of the eighth example. FIG. 23B is a cross-sectional view taken along line 23B—23B in FIG. 23A. In these figures, portions where a source electrode and a drain electrode are formed are omitted, but the portions are the same as those in the above-described conventional stripe-channel HEMT where the source electrode and the drain electrode are formed.

First, the structure of the FET of this example according to the invention is described. On the upper face of a semi-insulating GaAs substrate 101, a semiconductor layered structure 180 is formed. The semiconductor layered structure 180 includes: an i-GaAs layer 102 (thickness: 500 nm) at an impurity concentration of $2\times10^{16}/cm^3$ or less, and to which impurities are substantially not doped; an n-AlGaAs layer 140 (thickness: 50 nm) which ie formed on the i-GaAs layer 102 and to which silicon is doped at a concentration of $2\times10^{18}/cm^3$; an n-InGaAs layer 141 (thickness: 10 nm) which is formed on the n-AlGaAs layer 140 and to which silicon is doped as n-type impurities at a concentration of $5\times10^{17}/cm^3$; and an n-AlGaAs layer 142 (thickness: 20 nm) which is formed on the n-InGaAs layer 141 and to which silicon is doped at a concentration of $2\times10^{18}/cm^3$.

The upper face of the semiconductor layered structure 180 has a plurality of recesses 111. The recesses 111 are formed so as to reach the i-GaAs layer 102. The recesses 111 have a depth of 200 nm measured from the surface of the semiconductor layered structure 180. By the recesses 111, a plurality of ridges 110 are formed. Each of the ridges 110 includes the n-AlGaAs layer 142, the n-InGaAs layer 141, the n-AlGaAs layer 140 and the i-GaAs layer 102. The n-InGaAs layer 141 serves as a channel. The plan structure of a channel is the same as that of the conventional stripe-channel HEMT shown in FIG. 31C. The width of the stripe-shaped n-InGaAs layer 141 included in each of the ridges 110 is 0.2 µm. The effective gate width $W_g$ of the FET is determined by the number of the formed ridges 110.

At a side face of the ridge 110, side faces of the n-AlGaAs layer 142, the n-InGaAs layer 141, the n-AlGaAs layer 140 and the i-GaAs layer 102 are exposed. In the directions from the exposed sides of the n-InGaAs layer 141 to the inside of the ridge 110, the n-InGaAs layer 141 is removed so as to form side grooves 195 having a depth of 50 nm in the side portions of the ridge 110.

A gate electrode 201 is formed on top and side faces of the ridges 110 and bottom faces of the recesses 111, in a direction perpendicular to a direction in which the gate electrode 201 extends. The gate electrode 201 is not formed in the grooves 195 which are formed in the side portions of the ridges 110. Accordingly, the grooves 195 under the gate electrode 201 are vacant.

In the FET of this example, as in the sixth example, a double heterostructure is used. However, in the sixth example, the electron density of the n-InGaAs layer 141 is extremely high, so that there arise problems in that the gate breakdown voltage deteriorates, and the leakage current in the reverse direction of the Schottky junction is increased. Moreover, NF is degraded by the leakage current and the bias point is shifted.

In the FET of this example, the grooves 195 are formed in the side portions of the ridges 110, so that the gate electrode is not in contact with the n-InGaAs layer 141. Therefore, the gate breakdown voltage can be improved. The grooves 195 are formed in both the side portions of each of the ridges 110, so that the effective channel length can be reduced to 0.1 µm. If an etching solution with good selectivity and controllability is used, the channel length can be stably reduced to 0.1 µm with good reproducibility, whereby a superior one-dimensional effect can be attained.

Figure 24:
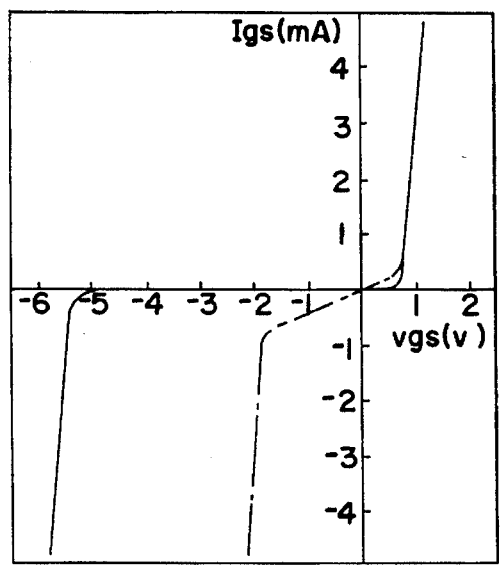
FIG. 24 shows diode characteristics of the FET of the eighth example.

FIG. 24 shows forward and reverse bias characteristics between the gate and the source of the FET of this example. The gets reverse breakdown voltage is improved by 3 V or more.

In this example, as in the conventional stripe-channel HEMT, the ridges 110 are formed so as to connect the source electrode 210 to the drain electrode 211. Alternatively, as in the first example, the ridged 110 may be formed only directly under the gate electrode 201.

The FET of this example can be fabricated by the same method as that for the FET of the sixth example, except for the formation of the grooves 195 in the side portions of the ridges 110. After forming the ridges in the semiconductor layered structure 180, the n-InGaAs layer 141 can be selectively etched to the direction toward the inside of the respective ridges 110 by using a mixed solution of tartaric acid, hydrogen peroxide, and ammonia. By etching the n-InGaAs layer 141 by 50 nm from the side faces thereof in the direction toward the inside of the ridge 110, the effective channel length $L_{ch}'$ can be reduced to 0.1 µm. In this way, the grooves 195 can be formed in the side portions of the ridges 110.

EXAMPLE 9

Figure 25A:
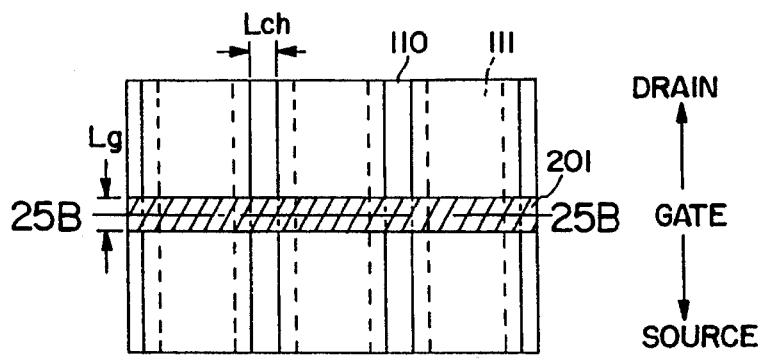
FIG. 25A is a plan view showing an FET in a ninth example according to the invention.
Figure 25B:
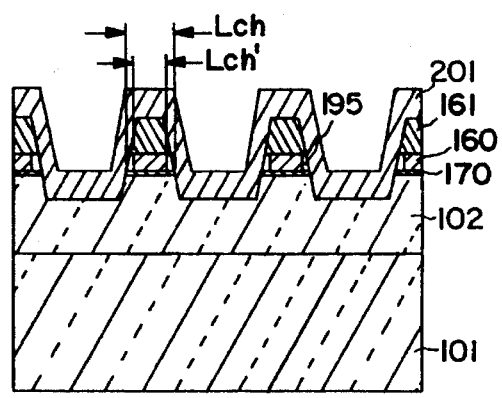
FIG. 25B is a cross-sectional view taken along line 25B—25B in FIG. 25A.

Referring to FIGS. 25A and 25B, a ninth example of the invention will be described. FIG. 25A is a plan view showing a main portion of an FET of the ninth example. FIG. 25B is a cross-sectional view taken along line 25B—25B in FIG. 25A. In these figures, portions where a source electrode and a drain electrode are formed are omitted, but the portions are the same as those in the above-described conventional stripe-channel HEMT where the source electrode and the drain electrode are formed.

First, the structure of the FET of this example according to the invention is described. On the upper face of a semi-insulating GaAs substrate 101, a semiconductor layered structure 180 is formed. The semiconductor layered structure 180 includes: an i-GaAs layer 102 (thickness: 500 nm) at an impurity concentration of $2\times10^{16}/cm^3$ or less, and to which impurities are substantially not doped; an n-AlGaAs layer 160 (thickness: 50 nm) which is formed on the i-GaAs layer 102 and to which silicon is doped at a contentration of $2\times10^{18}/cm^3$; and an n-GaAs layer 161 (thickness: 10 nm) which is formed on the n-AlGaAs layer 160 and to which silicon is doped as n-type impurities at a concentration of $5\times10^{17}/cm^3$.

Figure 26:
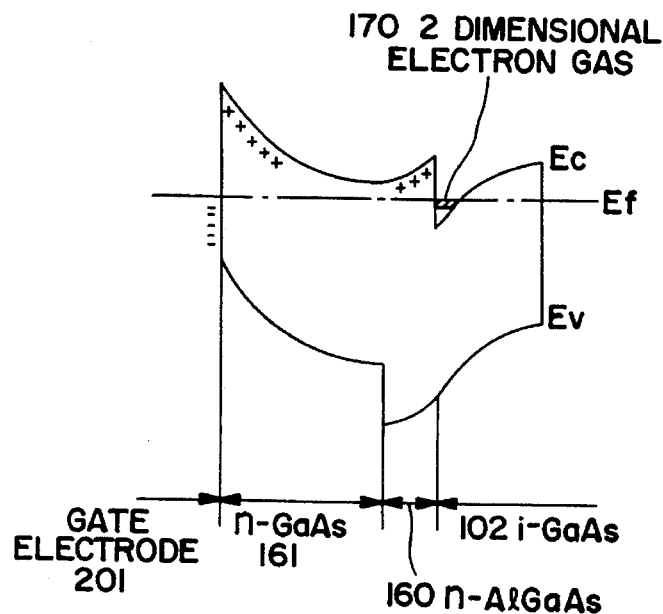
FIG. 26 shows an energy band diagram under the gate electrode of the FET of the eighth example.

FIG. 26 shows an energy band diagram under the gate electrode of the FET of this example. The n-AlGaAs layer 160 serves as an electron supplying layer, and a two-dimensional electron gas layer 170 is formed in the i-GaAs layer 102 in the vicinity of the interface between the n-AlGaAS layer 160 and the i-GaAs layer 102.

The upper face of the semiconductor layered structure 180 has a plurality of recesses 111. The recesses 111 are formed to reach the i-GaAs layer 102. The recesses 111 have a depth of 200 nm measured from the surface of the semiconductor layered structure 180. By the recesses 111, a plurality of ridges 110 are formed.

Each of the ridges 110 includes the stripe-shaped two-dimensional electron gas layer 170. The plan structure of a channel is the same as that of the conventional stripe-channel HEMT shown in FIG. 31C. The width of the stripe-shaped two-dimensional electron gas layer 170 included in each of The ridges 110 is 0.2 µm. The effective gate width $W_g$ of the FET is determined by the number of the formed ridges 110.

At a side face of the ridge 110, side faces of the n-GaAs layer 161, the n-AlGaAs layer 160 and the i-GaAs layer 102 are exposed. In the directions from the exposed sides of the n-GaAs layer 161 to the inside of the ridge 110, the n-GaAs layer 161 is removed so as to form side grooves 195 having a depth of 50 nm in the side portions of the ridge 110.

A gate electrode 201 is formed on top and side faces of the ridges 110 and bottom faces of the recesses 111, in a direction perpendicular to a direction in which the gate electrode 201 extends. The gate electrode 201 is not formed in the grooves 195 which are formed in the side portions of the ridges 110. Accordingly, the grooves 195 under the gate electrode 201 are vacant.

In the conventional stripe-channel HEMT, the two-dimensional electron gas layer in the i-GaAs layer is in contact with the gate electrode, so that there arise problems in that the gate breakdown voltage is deteriorated and that the leakage current in a reverse direction of the Schottky junction is increased. Moreover, NF is degraded by the leakage current and the bias point is shifted.

In the FET of this example, the grooves 195 are formed in the side portions of the ridges 110, so that the width $L_{ch}'$ of the n-AlGaAs layer 160 as the electron supplying layer is made smaller than the width $L_{ch}$ of the ridge 110. The two-dimensional electron gas layer 170 formed in the i-GaAs layer 102 is restricted by the ionized impurities generated in the n-AlGaAs layer 160, so that the two-dimensional electron gas layer 170 is formed only under the n-AlGaAs layer 160. Therefore, the two-dimensional electron gas is not in contact with the gate electrode 201. Accordingly, the gate breakdown voltage is improved. The grooves 195 are formed in both the side portions of each of the ridges 110, so that the effective channel length can be reduced to 0.1 μm. If an etching solution with good selectivity and controllability is used, the channel length can be stably reduced to 0.1 μm with good reproducibility, whereby a superior one-dimensional effect can be attained.

Figure 27:
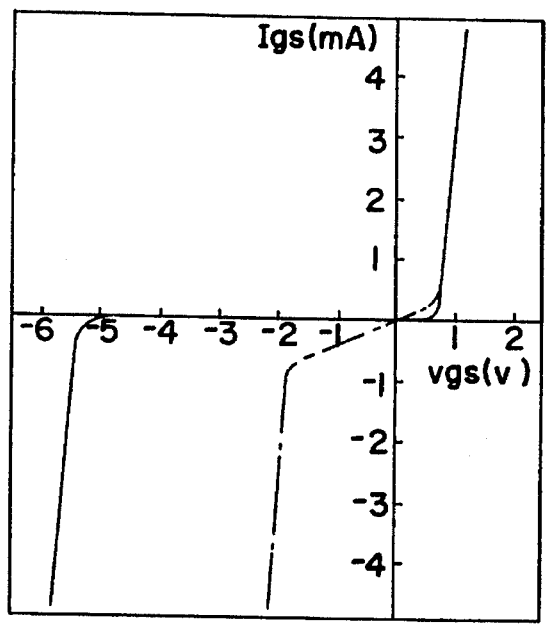
FIG. 27 shows diode characteristics of the FET of the ninth example.

FIG. 27 shows forward and reverse bias characteristics between the gate and the source of the FET of this example. The gate reverse breakdown voltage is improved by 3 V or more.

In this example, as in the conventional stripe-channel HEMT, the ridges 110 are formed so as to connect the source electrode (not shown) to the drain electrode (not shown). Alternatively, as in the first example, the ridges 110 may be formed only directly under the gate electrode 201.

The FET of this example can be fabricated by the same method as that for the FET of the sixth example, except for the formation of the grooves 195 in the side portions of the ridges 110. After forming the ridges in the semiconductor layered structure 180, the n-AlGaAs layer 160 can be selectively etched to the direction toward the inside of the respective ridges 110 by using a mixed solution of tartaric acid, hydrogen peroxide, and ammonia. By etching the n-AlGaAs layer 160 by 0.1 μm from the side faces thereof in the direction toward the inside of the ridges 110, the effective channel length $L_{ch}'$ can be reduced to 0.1 μm. In this way, the grooves 195 can be formed in the side portions of the ridges 110.

EXAMPLE 10

Figure 28A:
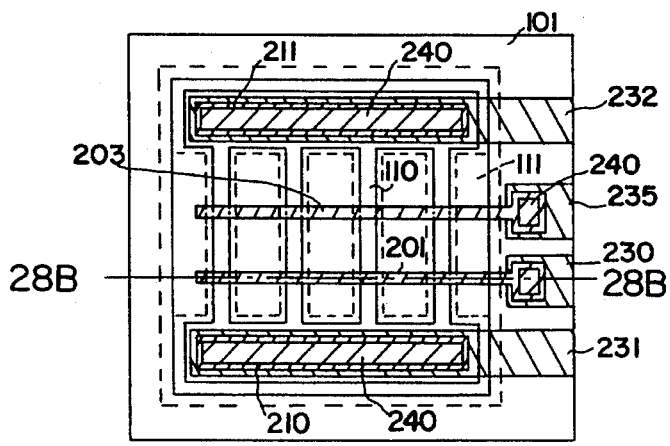
FIG. 28A is a plan view showing an FET in a tenth example according to the invention.
Figure 28B:
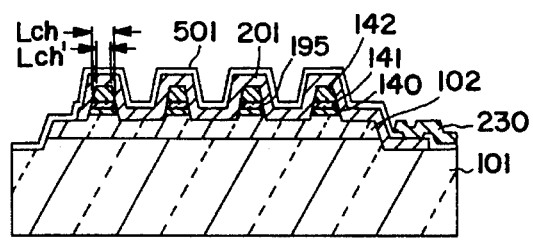
FIG. 28B is a cross-sectional view taken along line 28B—28B in FIG. 28A.

Referring to FIGS. 28A and 28B, a tenth example of the invention will be described. FIG. 28A is a plan view showing a main portion of an FET of the tenth example. FIG. 28B is a cross-sectional view taken along line 28B—28B in FIG. 28A.

First, the structure of the FET of this example according to the invention is described. On the upper face of a semi-insulating GaAs substrate 101, a semiconductor layered structure 180 is formed. The semiconductor layered structure 180 includes: an i-GaAs layer 102 (thickness: 500 nm) at an impurity concentration of $2 \times 10^{16}/cm^3$ or less, and to which impurities are substantially not doped; an n-AlGaAs layer 140 (thickness: 50 nm) which is formed on the i-GaAs layer 102 and to which silicon is doped at a concentration of $2 \times 10^{18}/cm^3$; an n-InGaAs layer 141 (thickness: 10 nm) which is formed on the n-AlGaAs layer 140 and to which silicon is doped as n-type impurities at a concentration of $5 \times 10^{17}/cm^3$; and an n-AlGaAs layer 142 (thickness: 20 nm) which is formed on the n-InGaAs layer 141 and to which silicon is doped at a concentration of $2 \times 10^{18}/cm^3$.

The upper face of the semiconductor layered structure 180 has a plurality of recesses 111. The recesses 111 are formed so as to reach the i-GaAs layer 102. The recesses 111 have a depth of 200 nm measured from the surface of the semiconductor layered structure 180. By the recesses 111, a plurality of ridges 110 are formed.

Each of the ridges 110 includes the n-AlGaAs layer 142, the n-InGaAs layer 141, the n-AlGaAs layer 140 and the i-GaAs layer 102. The n-InGaAs layer 141 serves as a channel. The plan structure of a channel is the same as that of the conventional stripe-channel HEMT shown in FIG. 31C. The width of the stripe-shaped n-InGaAs layer 141 included in each of the ridges 110 is 0.2 μm. The effective gate width $W_g$ of the FET is determined by the number of the formed ridges 110.

A first gate electrode 201 and a second gate electrode 203 are formed in a direction which is substantially perpendicular to a direction in which the ridges 110 extend on top and side faces of the ridges 110 and bottom faces of the recesses 111. In order to protect the surface of the FET, a silicon nitride film 501 is formed so as to cover the entire upper face of the semi-insulating GaAs substrate 101. The source electrode 210, the drain electrode 211, the first gate electrode 201, and the second gate electrode 203 are connected to a source interconnection 231, a drain interconnection 232, a first gate interconnection 230, and a second gate interconnection 235, respectively, via windows 240 formed in the silicon nitride film 501.

The FET of this example has a channel having a double heterostructure shown in the sixth example. Due to the double heterojunction formed by the AlGaAs layer and the InGaAs layer, electrons are accumulated in the InGaAs layer which has a smaller bandgap than the AlGaAs layer, The electrons accumulated in the n-InGaAs layer 141 as a channel can be confined in the two directions, i.e., from the upper side and the lower side, so that the leakage current can be prevented from being increased, even when the voltage between the drain and the source increases. Therefore, if the drain-source voltage $V_{ds}$ is increased, the drain conductance is not so increased and Is prevented from being increased in the non-linear manner.

Figure 29A:
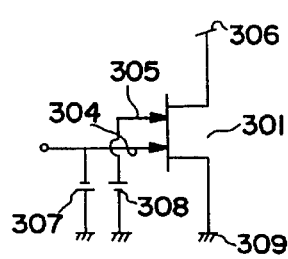
FIG. 29A is a circuit diagram for illustrating the operation of the FET of the tenth example.
Figure 29B:
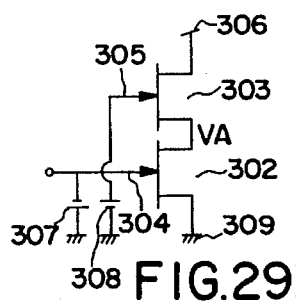
FIG. 29B is an equivalent circuit of the FET of the tenth example.

FIG. 29A is a circuit diagram for describing the operation of the FET according to this example. FIG. 29B is an equivalent circuit of the FET of this example. In a dual-gate FET 301 shown in FIG. 29A, a drain is connected to a power supply 306, and a source is grounded. To a first gate, a bias power supply 307 is connected. To a second gate, a bias power supply 308 is connected. In a first FET 302 shown in FIG. 29B, a source is grounded, and a drain is connected to a source of a second FET 303. In a second FET 303 shown in FIG. 29B, a drain is connected to a power supply 306. To a gate of the first FET 302, the bias power supply 307 is connected. To a gate of the second FET 303, the bias power supply 308 is connected. The potential of the drain of the first FET 302 is represented by VA.

In the dual-gate FET 301 shown An FIG. 29A, the first FET 302 and the second FET 303 are connected in series, as is shown in FIG. 29B. The potential $V_{g1}$ of the bias power supply 307 and the potential $V_{g2}$ of the bias power supply 308 are both fixed, and the potential $V_d$ of the power supply 306 is increased. Because the potential $V_{g1}$ is fixed, the current flowing through the second FET 303 can increase only by the increase due to the drain conductance. Therefore, the current flowing through the second FET 303 cannot increase, either. Because the potential $V_{g2}$ is fixed, the potential VA is substantially constant in order to maintain the potential between the gate and the source of the second FET 303. Accordingly, the voltage between the drain and the source of the first FET 302 does not substantially vary. As a result, the variation in current flowing through the first FET 302 and the drain conductance of a dual-gate FET is much smaller than that of a single-gate FET.

Figure 29C:
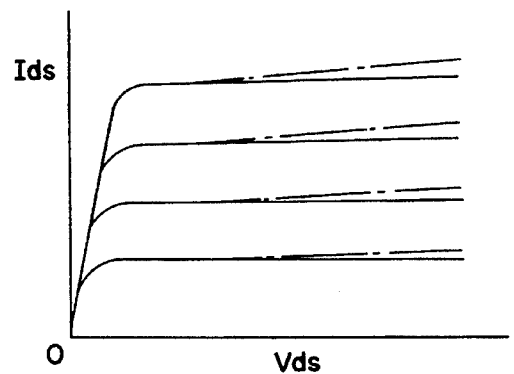
FIG. 29C shows a $V_{ds}$–$I_{ds}$ characteristic of the FET of the tenth example.

FIG. 29C is a $V_{ds}$–$I_{ds}$ characteristic of the FET of this example. As is seen from FIG. 29C, when compared with the conventional stripe-channel HEMT, the drain conductance characteristic of the FET of this example is greatly improved.

Figure 30:
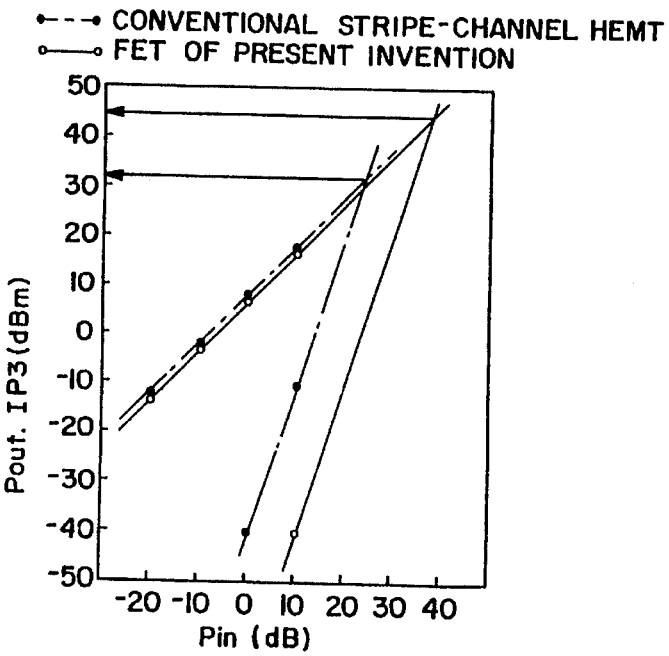
FIG. 30 shows an input-output characteristic of a high frequency amplifier in which the FET of the tenth example is incorporated.

FIG. 30 shows an input-output characteristic of a high frequency amplifier in which the FET of this example is incorporated. An output $P_{out}$ and a third-order high frequency wave IM3 obtained for an input $P_{in}$ are plotted. The crossing point of the $P_{out}$ line and the 1M3 line is improved by about 12 dB as compared with the conventional stripe-channel HEMT, so that the third-order high frequency wave is difficult to occur even when a large signal is input.

In this example, as in the conventional stripe-channel HEMT, the ridges 110 are formed so as to connect the source electrode 210 to the drain electrode 211. Alternatively, as in the first example, the ridged 110 may be formed only directly under the gate electrode 201. The gate electrode structure may be a structure in which a plurality of gate electrodes 201 and an interconnection 202, the same as described in the second or third example. Moreover, as is described in the eighth example, grooves 195 may be formed in the side portions of the ridges 110, so that the gate electrode 201 may not be in contact with the n-InGaAs layer 141.

The FET of this example can be fabricated by the same method as that for the FET of the sixth example, and a plurality of gate electrodes are formed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A field effect transistor comprising:

a semiconductor substrate having at least an upper face;

a semiconductor layered structure, formed on said upper face of said semiconductor substrate, said semiconductor layered structure including a channel layer;

a source electrode formed on said semiconductor layered structure;

a drain electrode formed on said semiconductor layered structure at a position apart from said source electrode in a first direction by a prescribed distance; and a gate electrode, formed on said semiconductor layered structure between said source electrode and said drain electrode, wherein said channel layer includes:

a first channel region positioned directly under the whole of said source electrode;

a second channel region positioned directly under the whole of said drain electrode;

a third channel region which is adjacent to all of a side of said first channel region and which is not positioned directly under any one of said gate electrode, said source electrode, and said drain electrode;

a fourth channel region which is adjacent to all of a side of said second channel region and which is not positioned directly under any one of said gate electrode, said source electrode, and said drain electrode; and a plurality of stripe-like middle channel regions for connecting said third channel region to said fourth channel region.

2. A field effect transistor according to claim 1, wherein said semiconductor layered structure includes a plurality of recesses arranged in a second direction which is substantially perpendicular to said first direction, and a plurality of stripe-like ridges interposed between said plurality of recesses, wherein said plurality of recesses are positioned between said third channel region and said fourth channel region, and wherein each of said stripe-like ridges includes a corresponding one of said plurality of stripe-like middle channel regions.

3. A field effect transistor according to claim 2, wherein said semiconductor layered structure includes said channel layer to which no impurity is doped, and an electron supplying layer formed on said channel layer.

4. A field effect transistor comprising:

a semiconductor substrate having at least an upper face;

a semiconductor layered structure, formed on said upper face of said semiconductor substrate, said semiconductor layered structure including a channel layer;

a source electrode formed on said semiconductor layered structure;

a drain electrode formed on said semiconductor layered structure at a position apart from said source electrode in a first direction by a prescribed distance; and a gate electrode, formed on said semiconductor layered structure between said source electrode and said drain electrode, wherein said channel layer includes:

a first channel region connected to said source electrode;

a second channel region connected to said drain electrode; and a plurality of stripe-like middle channel regions for connecting said first channel region to said second channel region, wherein said semiconductor layered structure includes a plurality of recesses arranged in a second direction which is substantially perpendicular to said first direction, and a plurality of stripe-like ridges interposed between said plurality of recesses, wherein said plurality of recesses are positioned between said first channel region and said second channel region, and wherein each of said stripe-like ridges includes a corresponding one of said plurality of stripe-like middle channel regions, and wherein said semiconductor layered structure includes a p-type semiconductor layer formed under said channel layer, said channel layer is made of an n-type semiconductor to form a depletion layer therein by the contact of said channel layer with said p-type semiconductor layer, and said channel layer being an uppermost layer of said semiconductor layered structure to form another depletion layer therein by the contact of said channel layer with said gate electrode.

5. A field effect transistor according to claim 4, further comprising means for applying voltage to said p-type semiconductor layer.

6. A field effect transistor comprising:

a semiconductor substrate having at least an upper face;

a semiconductor layered structure, formed on said upper face of said semiconductor substrate, said semiconductor layered structure including a channel layer;

a source electrode formed on said semiconductor layered structure;

a drain electrode formed on said semiconductor layered structure at a position apart from said source electrode in a first direction by a prescribed distance; and a gate electrode, formed on said semiconductor layered structure between said source electrode and said drain electrode, wherein said channel layer includes:

a first channel region connected to said source electrode;

a second channel region connected to said drain electrode; and a plurality of stripe-like middle channel regions for connecting said first channel region to said second channel region, wherein said semiconductor layered structure includes a plurality of recesses arranged in a second direction which is substantially perpendicular to said first direction, and a plurality of stripe-like ridges interposed between said plurality of recesses, wherein said plurality of recesses are positioned between said first channel region and said second channel region, and wherein each of said stripe-like ridges includes a corresponding one of said plurality of stripe-like middle channel regions, and wherein said semiconductor layered structure includes:

a first semiconductor layer containing n-type impurities at a first concentration;

a channel layer formed on said first semiconductor layer and containing the n-type impurities at a second concentration which is lower than said first concentration, said channel layer having a smaller bandgap than that of said first semiconductor layer; and a second semiconductor layer, formed on said channel layer, containing the n-type impurities at a concentration higher than said second concentration said second semiconductor layer having a larger bandgap than that of said channel layer.

7. A field effect transistor according to claim 6, further comprising means for applying voltage to said first semiconductor layer.

8. A field effect transistor comprising:

a semiconductor substrate having at least an upper face;

a semiconductor layered structure, formed on said upper face of said semiconductor substrate, said semiconductor layered structure including a channel layer;

a source electrode formed on said semiconductor layered structure;

a drain electrode formed on said semiconductor layered structure at a position apart from said source electrode in a first direction by a prescribed distance: and a gate electrode, formed on said semiconductor layered structure between said source electrode and said drain electrode, wherein said channel layer includes:

a first channel region connected to said source electrode;

a second channel region connected to said drain electrode; and a plurality of stripe-like middle channel regions for connecting said first channel region to said second channel region, wherein said semiconductor layered structure includes a plurality of recesses arranged in a second direction which is substantially perpendicular to said first direction, and a plurality of stripe-like ridges interposed between said plurality of recesses, wherein said plurality of recesses are positioned between said first channel region and said second channel region, and wherein each of said stripe-like ridges includes a corresponding one of said plurality of stripe-like middle channel regions, wherein said semiconductor layered structure includes:

a first semiconductor layer to which n-type impurities are added at a high concentration;

a channel layer, formed on said first semiconductor layer, to which the n-type impurities are added at a concentration lower than that of said first semiconductor layer, said channel layer having a smaller bandgap than that of said first semiconductor layer; and a second semiconductor layer, formed of said channel layer, to which the n-type impurities are added at a concentration higher than that of said channel layer, said second semiconductor layer having a larger bandgap than that of said channel layer, and wherein said stripe-like ridges each have grooves at side faces thereof, said grooves being formed by removing part of said channel layer.

9. A field effect transistor comprising:

a semiconductor substrate having at least an upper face;

a semiconductor layered structure, formed on said upper face of said semiconductor substrate, said semiconductor layered structure including a channel layer;

a source electrode formed on said semiconductor layered structure;

a drain electrode formed on said semiconductor layered structure at a position apart from said source electrode in a first direction by a prescribed distance; and a gate electrode, formed on said semiconductor layered structure between said source electrode and said drain electrode, wherein said channel layer includes:

a first channel region connected to said source electrode;

a second channel region connected to said drain electrode; and a plurality of stripe-like middle channel regions for connecting said first channel region to said second region, wherein said semiconductor layered structure includes a plurality of recesses arranged in a second direction which is substantially perpendicular to said first direction, and a plurality of strip-like ridges interposed between said plurality of recesses, wherein said plurality of recesses are positioned between said first channel region and said second channel region, and wherein each of said stripe-like ridges includes a corresponding one of said plurality of stripes-like middle channel regions, wherein said semiconductor layered structure includes said channel layer to which no impurity is doped, and an electron supplying layer formed on said channel layer, and wherein said stripe-like ridges each have grooves at side faces thereof, said grooves being formed by removing part of said electron supplying layer.

10. A field effect transistor comprising:

a semiconductor substrate having at least an upper face;

a semiconductor layered structure, formed on said upper face of said semiconductor substrate, said semiconductor layered structure including a channel layer;

a source electrode formed on said semiconductor layered structure; and a drain electrode formed on said semiconductor layered structure at a position apart from said source electrode in a first direction by prescribed distance, wherein said channel layer includes:

a first channel region connected to said source electrode;

a second channel region connected to said drain electrode; and a plurality of stripe-like middle channel regions for connecting said first channel region to said second channel region, wherein said semiconductor layered structure includes a plurality of recesses arranged in a second direction which is substantially perpendicular to said first direction, and a plurality of stripe-like ridges interposed between said plurality of recesses, wherein said plurality of recesses are positioned between said first channel region and said second channel region, wherein each of said stripe-like ridges includes a corresponding one of said plurality of stripe-like middle channel regions, and wherein said field effect transistor comprises a first gate electrode and a second gate electrode which are each formed on respective top and side faces of said plurality of stripe-like ridges and respective portions of said plurality of recesses, said first and second electrodes extending along said second direction and separated from each other in said first direction.

11. A field affect transistor according to claim 6, wherein said channel layer is made of InGaAs semiconductor, and said first semiconductor layer and said second semiconductor layer are made of AlGaAs semiconductor.

12. A field effect transistor comprising:

a semiconductor substrate having at least an upper face;

a semiconductor layered structure, formed on said upper face of said semiconductor substrate, said semiconductor layered structure including a channel layer and an electron supplying layer formed on said channel layer, said channel layer substantially containing no impurity;

a source electrode formed on said semiconductor layered structure;

a drain electrode formed on said semiconductor layered structure at a position apart from said source electrode in a first direction by a prescribed distance; and a gate electrode, formed on said semiconductor layered structure between said source electrode and said drain electrode, wherein said channel layer includes: a first channel region connected to said source electrode; a second channel region connected to said drain electrode; and a plurality of stripe-like middle channel regions for connecting said first channel region to said second channel region, wherein said semiconductor layered structure includes a plurality of recesses arranged in a second direction which is substantially perpendicular to said first direction, and a plurality of stripe-like ridges interposed between said plurality of recesses, said plurality of recesses are positioned between said first channel region and said second channel region, and each of said stripe-like ridges includes a corresponding one of said plurality of stripe-like middle channel regions, and wherein said gate electrode includes: a plurality of gate electrode portions formed to cover top faces of said plurality of stripe-like ridges, respectively; and an interconnection formed on said plurality of gate electrode portions and over said plurality of recesses.

13. A field effect transistor according to claim 12, wherein said plurality of recesses are filled with a silicon oxide film.

14. A field effect transistor according to claim 12, wherein each of said plurality of recesses provides a vacant portion below said interconnection.

15. A field effect transistor comprising:

a semiconductor substrate having at least an upper face;

a semiconductor layered structure, formed on said upper face of said semiconductor substrate, said semiconductor layered structure including a channel layer;

a source electrode formed on said semiconductor layered structure;

a drain electrode formed on said semiconductor layered structure at a position apart from said source electrode in a first direction by a prescribed distance; and a gate electrode, formed on said semiconductor layered structure between said source electrode and said drain electrode, wherein said channel layer includes:

a first channel region connected to said source electrode;

a second channel region connected to said drain electrode; and a plurality of stripe-like middle channel regions for connecting said first channel region to said second channel region, wherein said semiconductor layered structure includes a plurality of recesses arranged in a second direction which is substantially perpendicular to said first direction, and a plurality of stripe-like ridges interposed between said plurality of recesses, wherein said plurality of recesses are positioned between said first channel region and said second channel region, wherein each of said stripe-like ridges includes a corresponding one of said plurality of stripe-like middle channel regions, wherein said semiconductor layered structure includes said channel layer to which no impurity is doped, and an electron supplying layer formed on said channel layer, and wherein said gate electrode includes: a plurality of gate electrode portions formed to cover top faces of said plurality of stripe-like ridges, respectively; and an interconnection connecting said plurality of gate electrode portions to each other, wherein said interconnection is comprised of a material having a smaller resistivity than at least a portion of one of said plurality of gate electrode portions.

* * * * *

UNITED STATES PATENT AND TRADEMARK OFFICE
CERTIFICATE OF CORRECTION

PATENT NO. : 5,514,883
DATED : May 7, 1996
INVENTOR(S) : Nakatsuka et al.

It is certified that error appears in the above-indentified patent and that said Letters Patent is hereby corrected as shown below:

On the cover page, item [56] References cited add the following:

U.S. PATENT DOCUMENTS 4,989,052   1/1991   Okada et al.

FOREIGN PATENT DOCUMENTS 2554639    5/1985   France
1-287969   11/1989  Japan

OTHER PUBLICATIONS

H. Kawasaki et al., "Striped-Channel Low-Noise Pseudomorphic HEMT", IEICE Transations, vol. E74, No. 12, pp. 4110-4113 (Dec. 1991).

European Search Report dated 10/20/1995.

UNITED STATES PATENT AND TRADEMARK OFFICE
CERTIFICATE OF CORRECTION

Page 2 of 2

PATENT NO. : 5,514,883
DATED : May 7, 1996
INVENTOR(S) : Nakatsuka et al.

It is certified that error appears in the above-indentified patent and that said Letters Patent is hereby corrected as shown below:

On the cover page, item [57] Abstract, line 6, "electric" should be --electrode--.

Column 28, line 9, "of" should be --on--.

Column 29, line 23, between "respective" and "portions" insert --bottom face--.

Signed and Sealed this

Twenty-second Day of April, 1997

Attest:

BRUCE LEHMAN

*Commissioner of Patents and Trademarks*

*Attesting Officer*